US010929064B2

(12) United States Patent
Cho et al.

(10) Patent No.: US 10,929,064 B2
(45) Date of Patent: Feb. 23, 2021

(54) METHODS OF OPERATING MIXED DEVICE TYPE MEMORY MODULES, AND PROCESSORS AND SYSTEMS CONFIGURED FOR OPERATING THE SAME

(71) Applicant: SAMSUNG ELECTRONICS CO., LTD., Suwon-si (KR)

(72) Inventors: Youngjin Cho, Seoul (KR); Hee Hyun Nam, Seoul (KR); Hyo-Deok Shin, Seoul (KR); Junghwan Ryu, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 70 days.

(21) Appl. No.: 16/443,551

(22) Filed: Jun. 17, 2019

(65) Prior Publication Data

US 2019/0303045 A1    Oct. 3, 2019

Related U.S. Application Data

(63) Continuation of application No. 15/188,183, filed on Jun. 21, 2016, now Pat. No. 10,331,378.

(30) Foreign Application Priority Data

Aug. 27, 2015  (KR) .......................... 10-2015-0120915

(51) Int. Cl.
  *G06F 3/06*  (2006.01)
  *G11C 16/10*  (2006.01)
(52) U.S. Cl.
  CPC ............ *G06F 3/0659* (2013.01); *G06F 3/068* (2013.01); *G06F 3/0613* (2013.01); *G11C 16/10* (2013.01)

(58) Field of Classification Search
  CPC ...................................................... G06F 3/0659
  USPC ........................................................... 711/156
  See application file for complete search history.

(56) References Cited

U.S. PATENT DOCUMENTS

| | | | |
|---|---|---|---|
| 6,092,232 A * | 7/2000 | Nagai ............... | G11B 20/1833 369/53.35 |
| 6,260,127 B1 | 7/2001 | Olarig et al. | |
| 7,679,133 B2 | 3/2010 | Son et al. | |
| 8,553,466 B2 | 10/2013 | Han et al. | |
| 8,559,235 B2 | 10/2013 | Yoon et al. | |
| 8,654,587 B2 | 2/2014 | Yoon et al. | |
| 2002/0002662 A1 | 1/2002 | Olarig et al. | |
| 2009/0225623 A1 | 9/2009 | Walker | |
| 2011/0233648 A1 | 9/2011 | Seol et al. | |
| 2011/0246708 A1 * | 10/2011 | Li ....................... | G06F 13/4243 711/103 |
| 2012/0079181 A1 | 3/2012 | Okin et al. | |

(Continued)

*Primary Examiner* — Jae U Yu
(74) *Attorney, Agent, or Firm* — Sughrue Mion, PLLC

(57) ABSTRACT

An operational method of a memory module is provided. The method includes receiving, from an external of the memory module, a first command and a first address in synchronization with clock signals. Status information is output through a signal line, when first data corresponding the first address is available in a data buffer in response to the first command. A second command in synchronization with the clock signals after the transmitting the status information is received from the external of the memory module, a second command. In response to the second command, the first data being available in the data buffer is output through data lines.

20 Claims, 24 Drawing Sheets

(56) References Cited

U.S. PATENT DOCUMENTS

| | | |
|---|---|---|
| 2012/0099389 A1 | 4/2012 | Park et al. |
| 2013/0215659 A1* | 8/2013 | Saito .................. G11C 7/106 |
| | | 365/51 |
| 2013/0263116 A1 | 10/2013 | Haupt et al. |
| 2013/0329491 A1 | 12/2013 | Chang et al. |
| 2014/0075106 A1 | 3/2014 | Okin et al. |
| 2014/0201435 A1 | 7/2014 | Dong et al. |
| 2015/0067234 A1 | 3/2015 | Shin et al. |
| 2015/0248935 A1 | 9/2015 | Moshayedi et al. |
| 2017/0148814 A1 | 5/2017 | Rhie |
| 2018/0039528 A1 | 2/2018 | Kumar et al. |

\* cited by examiner

| ADDR_1 | addr_n1 | addr_r1 |
|--------|---------|---------|
| ADDR_2 | –       | addr_r2 |
| ADDR_3 | addr_n3 | –       |
| ⋮ | | |
| ADDR_m | –       | –       |

METHODS OF OPERATING MIXED DEVICE TYPE MEMORY MODULES, AND PROCESSORS AND SYSTEMS CONFIGURED FOR OPERATING THE SAME

CROSS-REFERENCE TO RELATED APPLICATIONS

This is a Continuation of U.S. application Ser. No. 15/188,183, filed Jun. 21, 2016, which claims priority from Korean Patent Application No. 10-2015-0120915 filed Aug. 27, 2015, in the Korean Intellectual Property Office, the entire contents of each of which are incorporated by reference herein in their entireties.

FIELD

The present inventive concept relates to semiconductor memory and methods of accessing the same.

BACKGROUND

A semiconductor memory refers to a memory device that is implemented using a semiconductor such as silicon (Si), germanium (Ge), gallium arsenide (GaAs), indium phosphide (InP), or the like. A semiconductor memory device is roughly divided into a volatile memory device and a nonvolatile memory device.

A volatile memory device refers to a memory device which loses data stored therein at power-off. The volatile memory device includes a static random access memory (SRAM), a dynamic ram (DRAM), a synchronous DRAM or the like. A nonvolatile memory device refers to a memory device which retains data stored therein even at power-off. The nonvolatile memory device includes a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), a ferroelectric RAM (FRAM), or the like.

In particular, the flash memory device is widely used due to fast operating speed, low power, low noise, large capacity, and the like. The flash memory device stores data using memory elements such as a floating gate memory cell, a charge trap flash memory cell, or the like. Data is stored in the memory elements such as a floating gate memory cell, a charge trap flash memory cell, or the like, by changing their threshold voltages.

A solid state drive (SSD) based on a flash memory can be used as mass storage in a personal computer, a notebook, a workstation, a server system, and the like. Typical SSD devices can be connected with a computing system based on a SATA interface or a PCI-express interface.

However, as the amount of data processed on a computing system increases, needed data throughput may exceed the data bandwidth or communication speed of an interface of the SSD devices, thereby causing a data bottleneck. Since the data bottleneck may cause a decrease in the performance of the computing system, various techniques are being developed to improve the performance.

For example, a double data rate (DDR) interface provides a faster access speed than conventional PCI or SATA interfaces. In addition, a memory module using various kinds of memory devices may be directly connected to a processor.

SUMMARY

A method of operating a memory module can include receiving, at the memory module, an active command and an associated row address that indicates that the active command is directed to a volatile memory device included in the memory module or to a non-volatile memory device included in the memory module. The volatile memory device or the non-volatile memory device can be activated based on the associated row address in response to the active command. Status information can be provided at the memory module indicating readiness of the memory module for receipt of an operation command associated with the active command and the associated row address.

In some embodiments according to the inventive concept, a method of operating a memory module can include receiving, from external of the memory module, an active command and an associated row address and activating a data unit included in the memory module, corresponding to the row address, in response to the active command. Status information can be transmitted from the memory module in response to activation of the data unit and an operation command and a column address associated with the active command can be received, from external of the memory module, in response to transmission of the status information. A data transaction can be performed using the column address, with the data unit activated by the active command in response to the operation command.

In some embodiments according to the inventive concept, a method of operating a processor circuit that is configured to control a memory module, can include transmitting, external to the processor circuit, an active command and an associated row address and receiving status information, from external to the processor circuit, indicating that data associated with the active command is ready for access by the processor circuit. An operation command and a column address can be transmitted external to the processor circuit in response to the status information and a data transaction can be transmitted, external to the processor circuit, to access the data indicated as ready for access responsive to the operation command.

In some embodiments according to the inventive concept, a system can include a first memory module and a second memory module configured to share a bus with the first memory module. A processor circuit can be configured to transmit a first active command and an associated first row address to the first memory module via the bus, and configured to transmit a first operation command and an associated first column address after a predetermined time elapses relative to the first active command, and configured to perform a data transaction corresponding to the first operation command to access the first memory module, where the processor circuit can be configured to transmit a second active command and an associated second row address to the second memory module via the bus, and can be configured to transmit a second operation command and an associated second column address to the second memory module after receiving status information from the second memory module, and can be configured to perform a data transaction corresponding to the second operation command to access the second memory module responsive to the status information.

BRIEF DESCRIPTION OF THE DRAWINGS

FIG. 18 is a diagram illustrating a mapping unit of FIG. 17;

DETAILED DESCRIPTION

Figure 1:
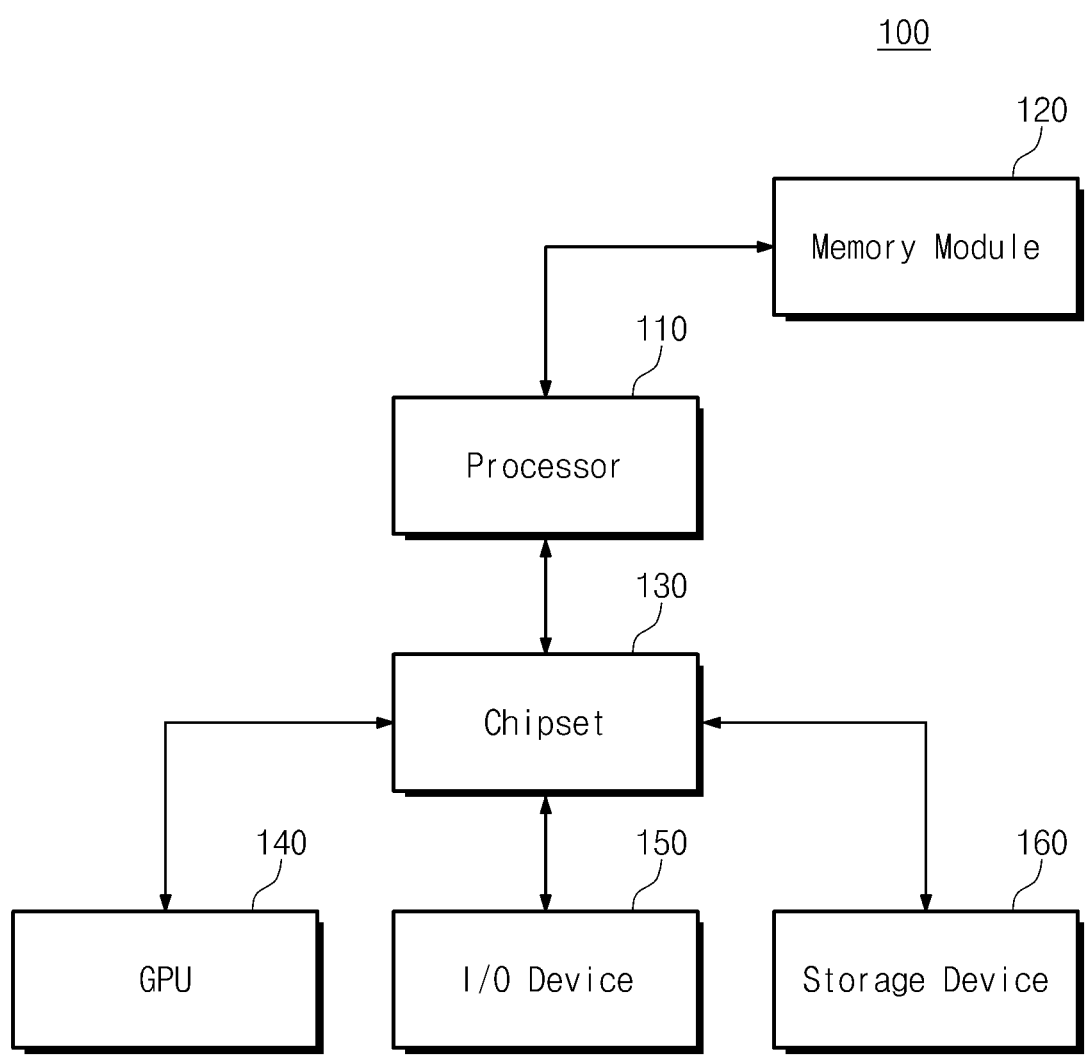
FIG. 1 is a block diagram illustrating a user system according to an embodiment of the inventive concept.

The inventive concepts are described hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

A system according to example embodiments of the inventive concept may include a processor (processor circuit) and a memory module directly connected to the processor. The processor may transmit an active command and a row address to the memory module. The memory module may activate a data unit corresponding to the row address in response to the active command. Afterwards, the memory module may transmit status information to the processor. The processor may transmit an operation command (e.g., a read or write command) and a column address to the memory module in response to the status information. The memory module may perform data transaction in response to the operation command.

As described above, the memory module may first activate the data unit corresponding to the row address in response to the active command and may then transmit the status information to the processor. In this case, a latency (e.g., tRCD) between the active command and the operation command may be variably adjusted with respect to memory devices with different operating characteristics, thereby making it possible to normally access the memory devices. That is, an interface change between the processor and the memory module may be minimized, and thus a cost needed to the memory modules may be reduced.

FIG. 1 is a block diagram illustrating a user system according to an embodiment of the inventive concept. Referring to FIG. 1, a user system 100 may include a processor 110, a memory module 120, a chipset 130, a graphic processing unit (GPU) 140, an input/output device 150, and a storage device 160.

In example embodiments, the user system 100 may include at least one of a computer, a portable computer, an ultra-mobile personal computer (UMPC), a workstation, a server, a netbook, a personal digital assistant (PDA), a portable computer, a web tablet, a wireless phone, a mobile phone, a smartphone, a digital camera, a digital audio recorder, a digital audio player, a digital picture recorder, a digital picture player, a digital video recorder, a digital video player, a device capable of transmitting or receiving information in a wireless environment, and various electronic devices included in a home network.

The processor 110 may control an overall operation of the user system 100. The processor 110 may perform various arithmetic operations, which are performed in the user system 100.

The memory module 120 may be directly connected to the processor 110. For example, the memory module 120 may be a dual in-line memory module (DIMM), and the memory module 120 may be installed in a DIMM socket directly connected to the processor 110 (to communicate with the processor 110).

The chipset 130 may be electrically connected to the processor 110, and may control hardware of the user system 100 under control of the processor 110. For example, the chipset 130 may be connected to each of the GPU 140, the input/output device 150, and the storage device 160 through main buses and may perform a bridge operation between the main buses.

The GPU 140 may perform a series of arithmetic operations for outputting image data of the user system 100. In example embodiments, the GPU 140 may be embedded in the processor 110 (such as in a system on chip).

The input/output device 150 may input data or an instruction to the user system 100 or may include various devices for outputting data to an external device. For example, the input/output device 150 may include user input devices such as a keyboard, a keypad, a button, a touch panel, a touch screen, a touch pad, a touch ball, a camera, a microphone, a gyroscope sensor, a vibration sensor, a piezoelectric element, a temperature sensor, a biometric sensor, or the like, and user output devices such as a liquid crystal display (LCD), an organic light emitting diode (OLED) display device, an active matrix OLED (AMOLED) display device, a light emitting diode (LED), a speaker, a motor, or the like.

The storage device 160 may be used as a mass storage medium of the user system 100. The storage device 160 may include mass storage media such as a hard disk drive (HDD), a solid state drive (SSD), a memory card, a memory stick, and the like.

In example embodiments, the memory module 120 may be implemented based on various memory devices including: a volatile memory device such as a DRAM, an SRAM, or an SDRAM or a nonvolatile memory device such as a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), or a ferroelectric RAM (FRAM).

In example embodiments, under control of the processor 110, the memory module 120 may write data or output the written data. In example embodiments, in the case where the memory module 120 includes a DRAM, the processor 110 may control the memory module 120 in compliance with a communication protocol such as DDR, low power DDR (LPDDR), and the like. For example, to read data stored in the memory module 120, the processor 110 may transmit an active command and a row address to the memory module 120. After a time (e.g., tRCD (RAS-to-CAS Delay)) elapses, the processor 110 may transmit a read command and a column address to the memory module 120. The memory module 120 may receive the read command and the column address and may output readout data after a given read delay time (or, read latency).

For example, in the case where the memory module 120 includes different kinds of memories (e.g., a flash memory), the processor 110 may transmit the active command and the row address to the memory module 120. After receiving status information from the memory module 120, the processor 110 may transmit the read command and the column address to the memory module 120. The memory module 120 may receive the read command and the column address and may output readout data after a given read delay time (e.g., RL (Read Latency)). In example embodiments, the status information may refer to an indication that data from a column or page corresponding to the column address is available in a data buffer. Alternatively, the status information may refer to an indication that a selected page or a selected column (i.e., a data unit) is activated.

In example embodiments, the status information may be provided to the processor 110 from the memory module 120 in various manners. For example, the memory module 120 may provide the status information to the processor 110 through a data line (i.e., DQ). Alternatively, the memory module 120 may provide the status information to the processor 110 through a separate signal li'ne which is included in a dual in-line memory module (DIMM).

In example embodiments, the status information may include information about a transact identification (ID). For example, the processor 110 may transmit an active command including the transact ID to the memory module 120. The memory module 120 may activate a data unit corresponding to the active command and may transmit status information, including information about a corresponding transact ID, to the processor 110. The processor 110 may perform a following operation (i.e., transmission of an operation command corresponding to the received transact ID) corresponding to the transact ID, based on the received status information.

As described above, after transmitting the active command and then receiving status information from the memory module 120, the processor 110 may transmit an operation command, and thus a latency (e.g., tRCD) between the active command and the operation command may be variably adjusted. Thus, it may be possible to support operations of a user system 100 including a memory module 120 that included various different types of memory devices having different latencies about different kinds of memories.

Figure 2:
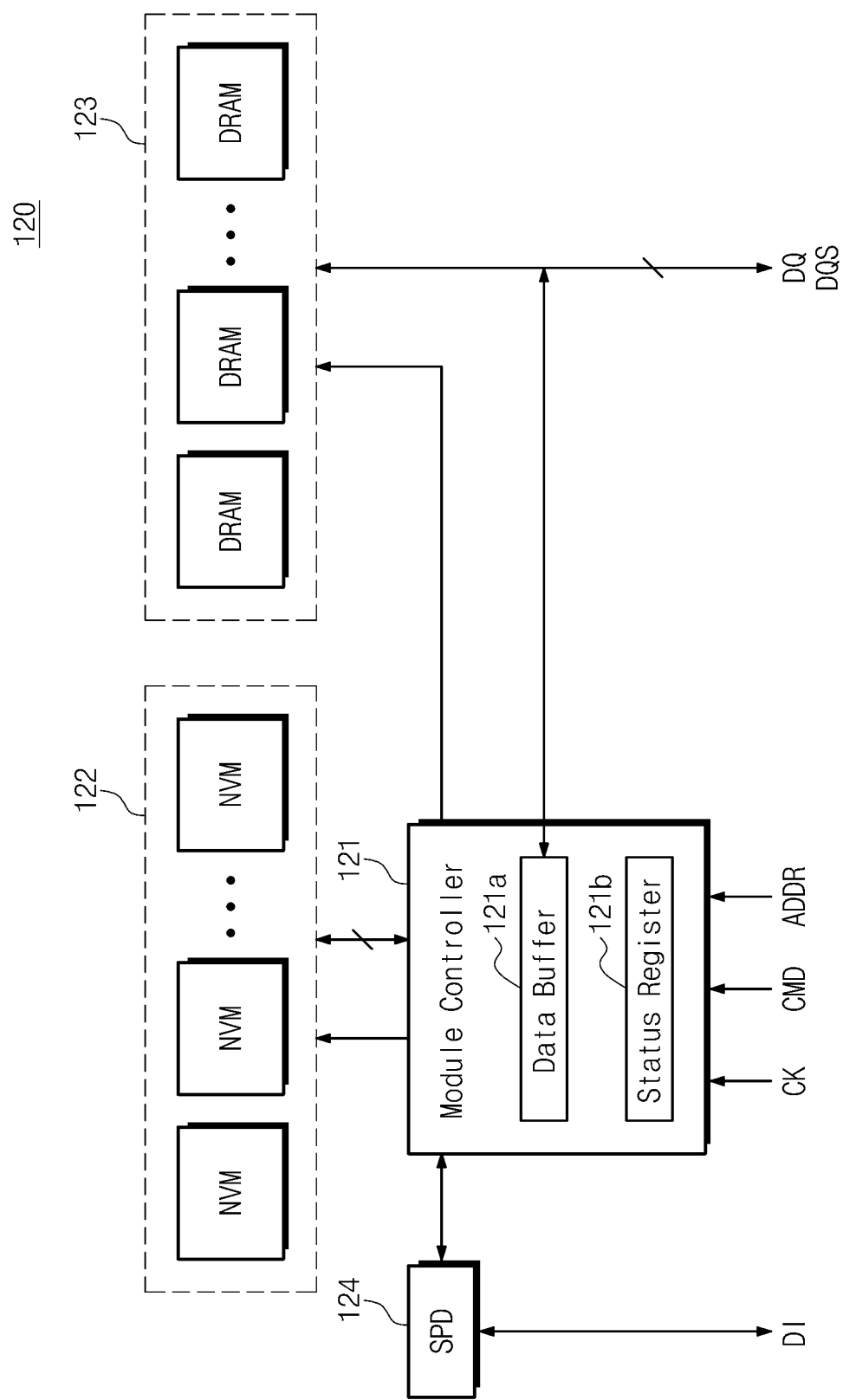
FIG. 2 is a block diagram illustrating a memory module illustrated in FIG. 1 in detail.

FIG. 2 is a block diagram illustrating a memory module illustrated in FIG. 1 in detail. For descriptive convenience and ease of illustration, it may be assumed that the memory module 120 is a nonvolatile memory module including a nonvolatile memory device 122 and a DRAM 123. However, the scope and spirit of the inventive concept may not be limited thereto. For example, the memory module 120 according to example embodiments of the inventive concept may be based on various kinds (and combinations) of memories.

Referring to FIGS. 1 and 2, the nonvolatile memory module 120 may include a module controller 121, the nonvolatile memory device 122, the DRAM 123, and a serial presence detect (SPD) chip 124.

The module controller 121 may receive a clock CK, a command CMD, and an address ADDR from the processor 110 and may control the nonvolatile memory device 122 and the DRAM 123 based on the received signals.

For example, in the case where the processor 110 accesses the DRAM 123, the module controller 121 may write data, which is provided through a data line DQ and a data strobe line DQS, at the DRAM 123 in response to signals received from the processor 110 or may provide the processor 110 with data (during a read), which was written to the DRAM 123, through the data line DQ and the data strobe line DQS. In other words, the module controller 121 may control the writing/reading of data which is provided to the DRAM 123 by the processor 110.

In the case where the processor 110 accesses the nonvolatile memory device 122, the module controller 121 may prepare a data buffer 121a in response to signals received from the processor 110 and may write status information about the data buffer 121a to a status register 121b. Afterwards, the module controller 121 may transmit the status information to the processor 110, under control of the processor 110, the module controller 121 may output data from the data buffer 121a, through the data line DQ and the data strobe line DQS or may store data, which is received through the data line DQ and the data strobe line DQS, in the prepared data buffer 121a. In example embodiments, the status register 121b may be a multi-purpose register (MPR). In other words, the module controller 121 may buffer data to/from the NVM 122 when accessed by the processor 110.

In example embodiments, the preparing of the data buffer 121a may indicate to store data, which is stored at a page, corresponding to a column address, from among a plurality of pages of the nonvolatile memory device 122, in the data buffer 121a in response to an active command and the column address received from the processor 110. Alternatively, the preparing of the data buffer 121a may indicate to prepare a space of the data buffer 121a, which temporarily stores data to be stored in the nonvolatile memory device 122, in response to the active command and the column address received from the processor 110. That is, in the case where the data buffer 121a is prepared, data transaction may be possible after a given latency in response to an operation command of the processor 110. In example embodiments, the data buffer 121a may be a storage device which can be randomly accessed by the processor 110.

The SPD 124 may be an EEPROM. The SPD 124 may include initial information or device information DI of the memory module 120. In example embodiments, the SPD 124 may include the initial information or the device information DI such as a module form, a module configuration, a storage capacity, a module type, an execution environment, or the like of the memory module 120. When the user system 100 including the memory module 120 is booted, the processor 110 may read the device information DI from the SPD 124 and may recognize the memory module 120 based on the device information DI. The processor 110 may control the memory module 120 based on the device information DI from the SPD 124. For example, the processor 110 may recognize the nonvolatile memory device 122 included in the memory module 120 based on the device information DI from the SPD 124 and may control the nonvolatile memory device 122 as described herein.

In example embodiments, the SPD 124 may communicate with the processor 110 through a serial bus. The processor 110 may exchange a signal with the SPD 124 through a serial bus. In example embodiments, the SPD 124 may communicate with the module controller 121 through a serial bus. In example embodiments, the serial bus may include at least one of 2-line serial buses such as an inter-integrated circuit (I2C), a system management bus (SMBus), a power management bus (PMBus), an intelligent platform management interface (IPMI), a management component transport protocol (MCTP), or the like.

Figure 3:
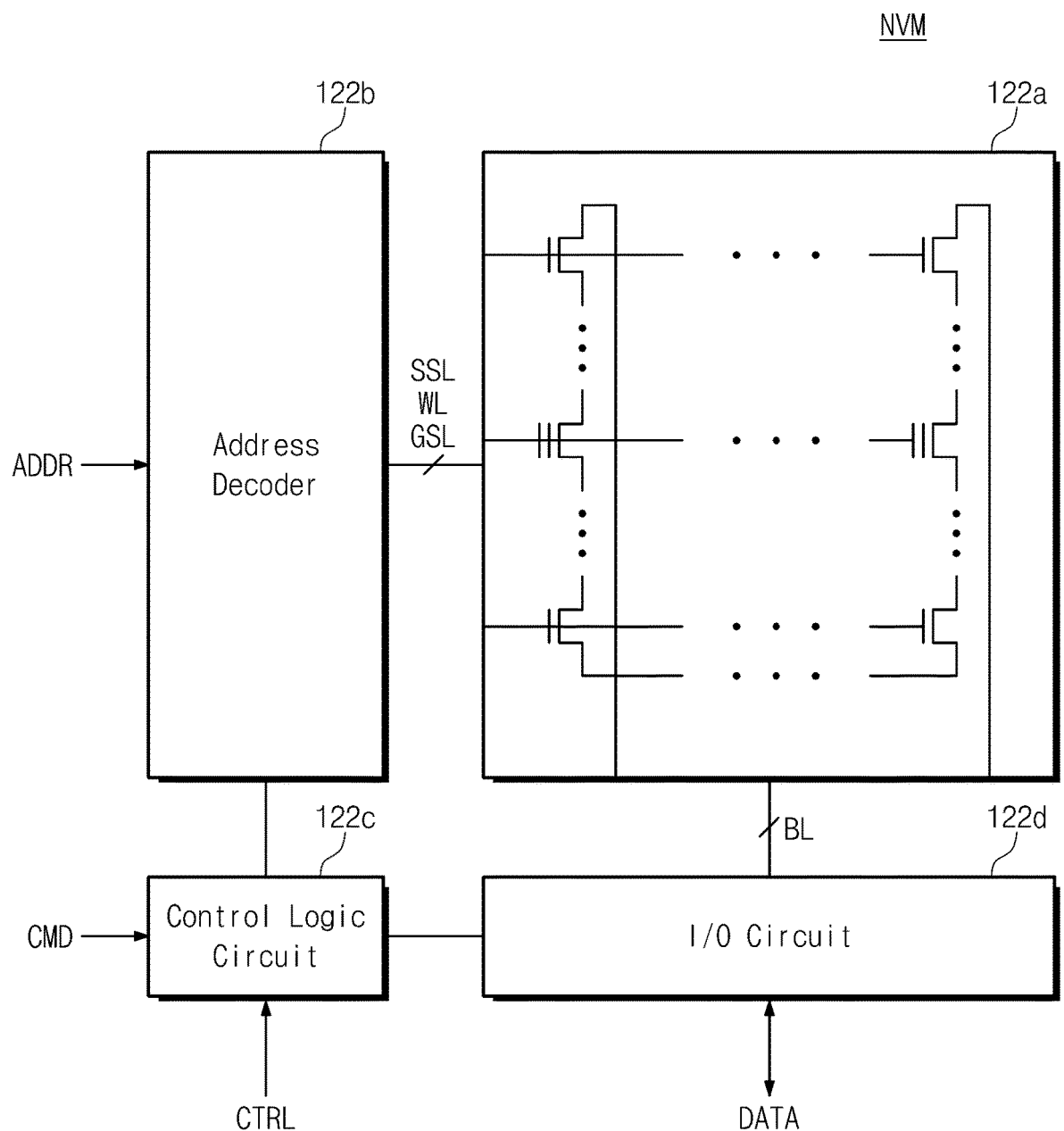
FIG. 3 is a block diagram illustrating a nonvolatile memory device of FIG. 1.

FIG. 3 is a block diagram illustrating a nonvolatile memory device of FIG. 2. In example embodiments, a nonvolatile memory device NVM may be one from among a plurality of nonvolatile memory devices in a nonvolatile memory device 123 of FIG. 1.

Referring to FIGS. 2 and 3, a nonvolatile memory device NVM may include a memory cell array 122a, an address decoder 122b, a control logic circuit 122c, and an input/output circuit 122d.

The memory cell array 122a may include a plurality of memory blocks. Each of the memory blocks may include a plurality of cell strings, each of which includes a plurality of memory cells. The memory cells may be connected with a plurality of word lines, respectively. Each of the memory cells may be arranged along a row direction and a column direction, and provide a plurality of pages.

The address decoder 122b may be connected with the memory cell array 121a through the word lines WL, string selection lines SSL, and ground selection lines GSL. The address decoder 122b may receive and decode an address ADDR from the module controller 121. The address decoder 122b may select at least one of the word lines WL based on the decoded address and may control the selected word line. In example embodiments, the address ADDR may be an address generated by the module controller 121 using an address provided by the processor 110. The address ADDR may be an address may be an address corresponding to the nonvolatile memory device NVM.

The control logic circuit 122c may control the address decoder 122b and the input/output circuit 122d in response to a command CMD and a control signal CTRL from the module controller 121. In example embodiments, the module controller 121 may provide the nonvolatile memory device NVM with the command CMD and the control signal CTRL corresponding to a command from the processor 110.

The input/output circuit 122d may be connected to the memory cell array 121a through the bit lines BL. The input/output circuit 122d may exchange data with the module controller 121. The input/output circuit 122d may control the bit lines to read data from the memory cell array 122a or program data to the memory cell array 122a. In example embodiments, the input/output circuit 122d may include a plurality of page buffers. The page buffers may be respectively connected with the bit lines and may store data received from the bit lines.

In example embodiments of the inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In example embodiments of the inventive concept, the 3D memory array includes vertical NAND strings that are vertically oriented such that at least one memory cell is located over another memory cell. The at least one memory cell may comprise a charge trap layer. Each vertical NAND string may include at least one select transistor located over memory cells, the at least one select transistor having the same structure with the memory cells and being formed monolithically together with the memory cells.

The following patent documents, which are hereby entirely incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654, 587; 8,559,235; and US Pat. Pub. No. 2011/0233648.

Figure 4:
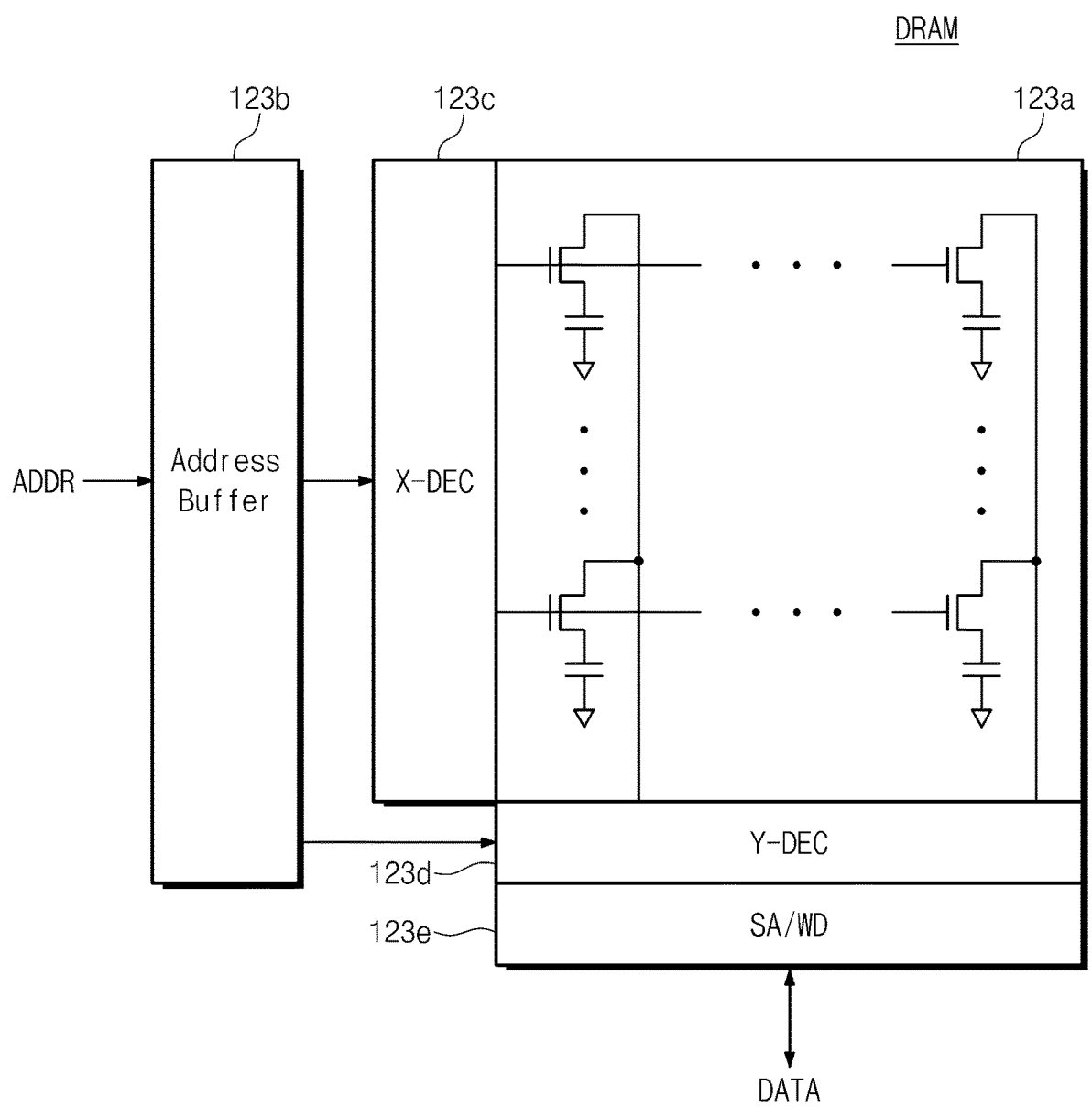
FIG. 4 is a block diagram illustrating a DRAM device of FIG. 2.

FIG. 4 is a block diagram illustrating a DRAM device of FIG. 2. In example embodiments, the DRAM device may be one from among a plurality of DRAM device 123 of FIG. 2. Referring to FIGS. 2 and 4, a DRAM device may include a memory cell array 123a, an address buffer 123b, a row decoder (hereinafter referred to as "X-decoder") 123c, a column decoder (hereinafter referred to as "Y-decoder") 123d, and a sense amplifier and write driver block 123e.

The memory cell array 121a may include a plurality of memory cells. The memory cells may be connected with a plurality of word lines and a plurality of bit lines. Each of the memory cells may include a transistor and a capacitor.

The address decoder 123b may receive an address ADDR from the module controller 121 and may provide the received address to the X-decoder 123c and the Y-decoder 123d.

The X-decoder 123c may be connected to the memory cell array 123a through the bit lines BL. The X-decoder 123c may select at least one of the word lines WL based on the address ADDR from the address buffer 123b and may activate the selected word line.

The Y-decoder 123d may be connected to the memory cell array 123a through the bit lines BL. The Y-decoder 123d may control the bit lines based on the address ADDR from the address buffer 123b.

The sense amplifier and write driver block 123e may be connected with the bit lines included in the memory cell array 123a. The sense amplifier and write driver block 123e may sense a voltage change of a bit line activated among the bit lines and may amplify and output the sensed voltage change. Alternatively, the sense amplifier and write driver block 123e may adjust voltages of bit lines activated from the bit lines based on data received from an external device (e.g., the processor 110).

In example embodiments, the nonvolatile memory device NVM and the DRAM device DRAM which are described with reference to FIGS. 3 and 4 may be, but not limited to, an example. Memory devices included in the memory module 120 may include various memory devices such as a PRAM, a ReRAM, a FRAM, an MRAM, a NOR flash memory, a NAND flash memory, a DRAM, a SRAM, a SDRAM, or a combination thereof.

Figure 5:
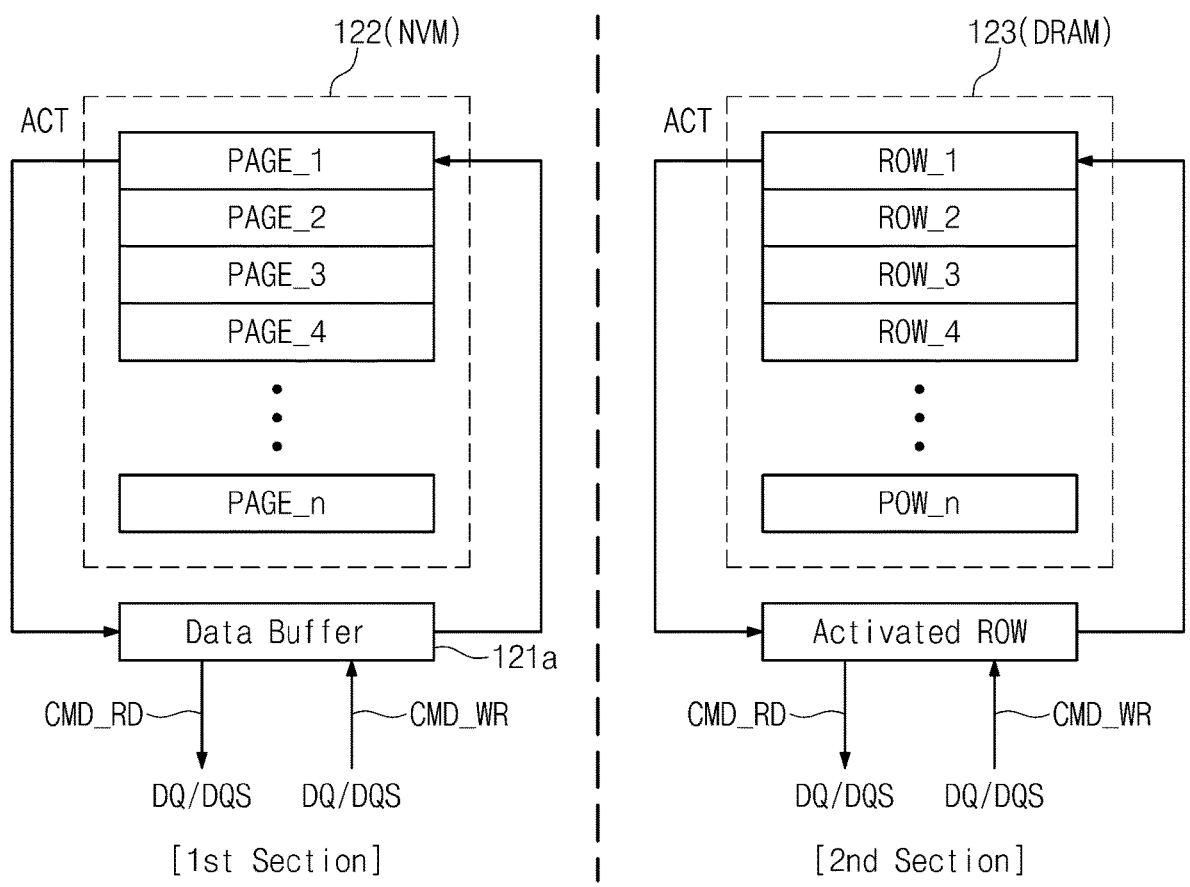
FIG. 5 is a diagram for describing an operation of devices FIGS. 3 and 4.

FIG. 5 is a diagram for describing an operation of devices FIGS. 3 and 4. Referring to FIGS. 2 to 5, each of the nonvolatile memory devices 122 and the DRAM device 123 may output or store data under control of the module controller 121.

For example, as illustrated in a first section of FIG. 5, the nonvolatile memory device 122 may include a plurality of pages PAGE_1 to PAGE_n. The nonvolatile memory device 122 may program or read data by the page. When reading data stored in the nonvolatile memory device 122, the module controller 121 may store data, which is stored in a page (e.g., a first page PAGE_1) selected from the pages PAGE_1 to PAGE_n of the nonvolatile memory device 122, in the data buffer 121a in response to an active command ACT. Afterwards, the module controller 121 may output data, which is stored in the data buffer 121a, to the processor 110 through the data signal DQ and the data strobe signal DQS in response to a read command CMD_RD.

Alternatively, when writing data to the nonvolatile memory device 122, the module controller 121 may store data, which is stored in a page (e.g., a first page PAGE_1) selected from the pages PAGE_1 to PAGE_n of the nonvolatile memory device 122, in the data buffer 121a in response to the active command ACT. Afterwards, in response to a write command CMD_WR, the module controller 121 may store data, which is received through the data signal DQ and the data strobe signal DQS, in the data buffer 121a and may program the data stored in the data buffer 121a to the selected page PAGE_1 in the NVM 122. In other words, the targeted page for the write command may first be read from the NVM 122 if stored in the data buffer 121a which can be modified using the data provided by the processor 110 with the write command. In example embodiments, the module controller 121 may control the nonvolatile memory device 122 such that data stored in the data buffer 121a is programmed to a page other than the selected page. The module controller 121 may manage the above-described operation through the address conversion operation.

As illustrated in a second section of FIG. 5, the DRAM device 123 may include a plurality of rows ROW_1 to ROW_n. When reading data stored in the DRAM device 123, the module controller 121 may activate one (e.g., a first row ROW_1) selected from the rows ROW_1 to ROW_n in response to the active command ACT. Afterwards, the module controller 121 may output data of the activated row to the processor 110 through the data signal DQ and the data strobe signal DQS in response to a read command CMD_RD.

When writing data to the DRAM device 123, the module controller 121 may activate one (e.g., a first row ROW_1) selected from the rows ROW_1 to ROW_n in response to the active command ACT. Afterwards, the module controller 121 may write data, which is received through the data signal DQ and the data strobe signal DQS, to the activated row in response to a write command CMD_WR.

In example embodiments, in the case where the data buffer 121a is prepared, the module controller 121 may transmit the status information to the processor 110 and may receive a read command CMD_RD or a write command CMD_WR from the processor 110 so as to properly adjust the latency for the type of memory device being accessed.

In example embodiments, the active command may include a row access strobe (RAS) signal. In example embodiments, the active command may be transmitted to a memory module together with an active signal ACT. In example embodiments, the read command CMD_RD or the write command CMD_WR may include a column access strobe (CAS) signal or a write enable (WE) signal.

In example embodiments, according to a conventional DDR interface, the processor 110 may transmit an active command ACT to the memory module 120 and may then transmit an operation command CMD_RD or CMD_WR to the memory module 120 after a given time (e.g., tRCD) elapses. Since having a fast operating speed, the DRAM device 123 may activate a selected row for a given time (e.g., tRCD). However, since an operating speed of the nonvolatile memory device 122 is slower than that of the DRAM device 123, it may not be possible to read a selected page of the nonvolatile memory device 122 within the same time as that of the DRAM 123 (e.g., tRCD) and prepare the read page at the data buffer. For this reason, the processor 110 may not control the nonvolatile memory device 122 normally (or directly).

However, as described above, the memory module 120 according to an embodiment of the inventive concept may transmit the status information to the processor 110 after preparing the data buffer 121a with respect to a selected page in response to the active command ACT. The processor 110 may transmit the operation command CMD_RD or CMD_WR to the memory module 120 in response to the status information. In other words, the processor 110 and the memory module 120 may variably adjust a latency between the active command ACT and the operation command (e.g., CMD_RD or CMD_WR) based on the type of memory that is to be accessed. That is, the processor 110 may drive different types of memories having different operating speeds in the same way by using the status information to adjust for the different latencies.

For descriptive convenience, below, it may be assumed that activation about a selected page indicates an operation to read data of the selected page and store the read data in a data buffer. Alternatively, it may be assumed that activation about a selected page indicates an operation to prepare a data buffer in which data to be stored in the selected page is temporarily stored. That is, in the case where the selected page is activated, a data buffer may be previously prepared for data transaction about a read or write command.

Figure 6:
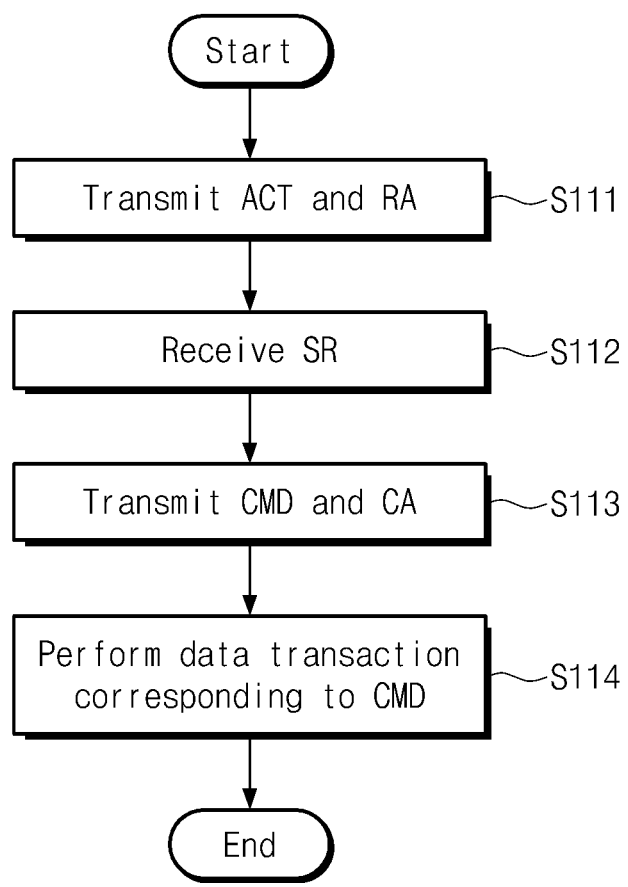
FIG. 6 is a flow chart illustrating an operation of a processor of FIG. 1.

FIG. 6 is a flowchart illustrating an operation of a processor of FIG. 1. Referring to FIGS. 1, 2, and 6, in a step S111, the processor 110 may transmit an active command ACT and a row address RA to the memory module 120. The row address RA may include a chip address, a bank address, or a row address of the DRAM device 123. Alternatively, the row address RA may include a chip address, a block address, or a page address of the nonvolatile memory device 122.

In a step S112, the processor 110 may receive the status information SR from the memory module 120. In example embodiments, the processor 110 may receive the status information SR from the memory module 120 through various techniques. For example, the processor 110 may receive the status information SR, which is written in the status register 121b, through the data signal DQ and the data strobe signal DQS from the memory module 120. Alternatively, the processor 110 may receive the status information SR through separate signal lines. In example embodiments, in the case where the nonvolatile memory device 122 is accessed, the status information SR may include information indicating that the data buffer 121a corresponding to a selected page is ready for access.

In a step S113, the processor 110 may transmit a command CMD and a column address CA to the memory module 120. For example, the processor 110 may transmit a read command CMD_RD or a write command CMD_WR to the memory module 120 together with the column address CA.

In a step S114, the processor 110 may perform a data transaction corresponding to a command CMD. For example, in the case where the command CMD is the read command CMD_RD, the processor 110 may receive data, which corresponds to the row address RA and the column address CA, from the memory module 120. For example, in the case where the command CMD is the write command CMD_WR, the processor 110 may transmit data, which corresponds to the row address RA and the column address CA, to the memory module 120.

As described above, unlike a conventional processor, the processor 110 according to example embodiments of the inventive concept may transmit the active command ACT and may then receive the status information SR from the memory module 120. After receiving the status information, the processor 110 may transmit the command and data. That is, a latency between the active command ACT and the operation command (e.g., CMD_RD or CMD_WR) may be variably adjusted according to the memory type, and thus the processor 110 may utilize different types of memories.

Figure 7:
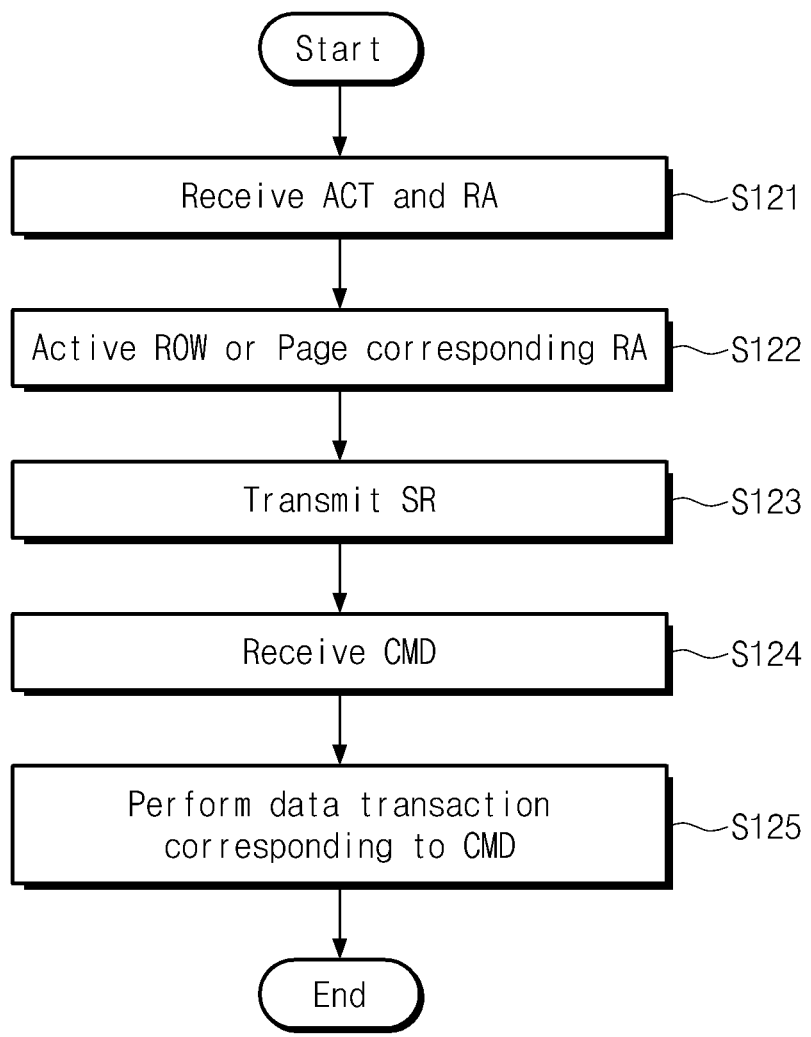
FIG. 7 is a flowchart illustrating an operation of a memory module of FIG. 1.

FIG. 7 is a flowchart illustrating an operation of a memory module of FIG. 1. Referring to FIGS. 1, 2, and 7, in a step S121, the memory module 120 may receive an active command ACT and a row address RA. In example embodiments, the row address RA, as described above, may include information about a page or a row corresponding to the nonvolatile memory device 122 or the DRAM device 123.

In a step S122, the memory module 120 may activate a page or a row corresponding to the received row address RA. For example, as described above, in the case where the row address RA includes information about a row of the DRAM device 123, the memory module 120 may activate the selected row. Alternatively, in the case where the row address RA includes information about a page of the nonvolatile memory device 122, the memory module 120 may activate the selected page.

In a step S123, the memory module 120 may transmit the status information SR to the processor 110. For example, after activating the selected page or the selected row, the memory module 123 may transmit the status information SR to the processor 110. In example embodiments, the status information SR may be provided to the processor 110 through various techniques. For example, the memory module 120 may receive a command for reading the status information SR and may provide the status information SR to the processor 110 through the data signal DQ and the data strobe signal DQS in response to the received command. Alternatively, the memory module 123 may provide the status information SR to the processor 110 through separate signal lines.

In a step S124, the memory module 120 may receive a command CMD.

In a step S125, the memory module 120 may perform a data transaction corresponding to the received command CMD.

Figure 8:
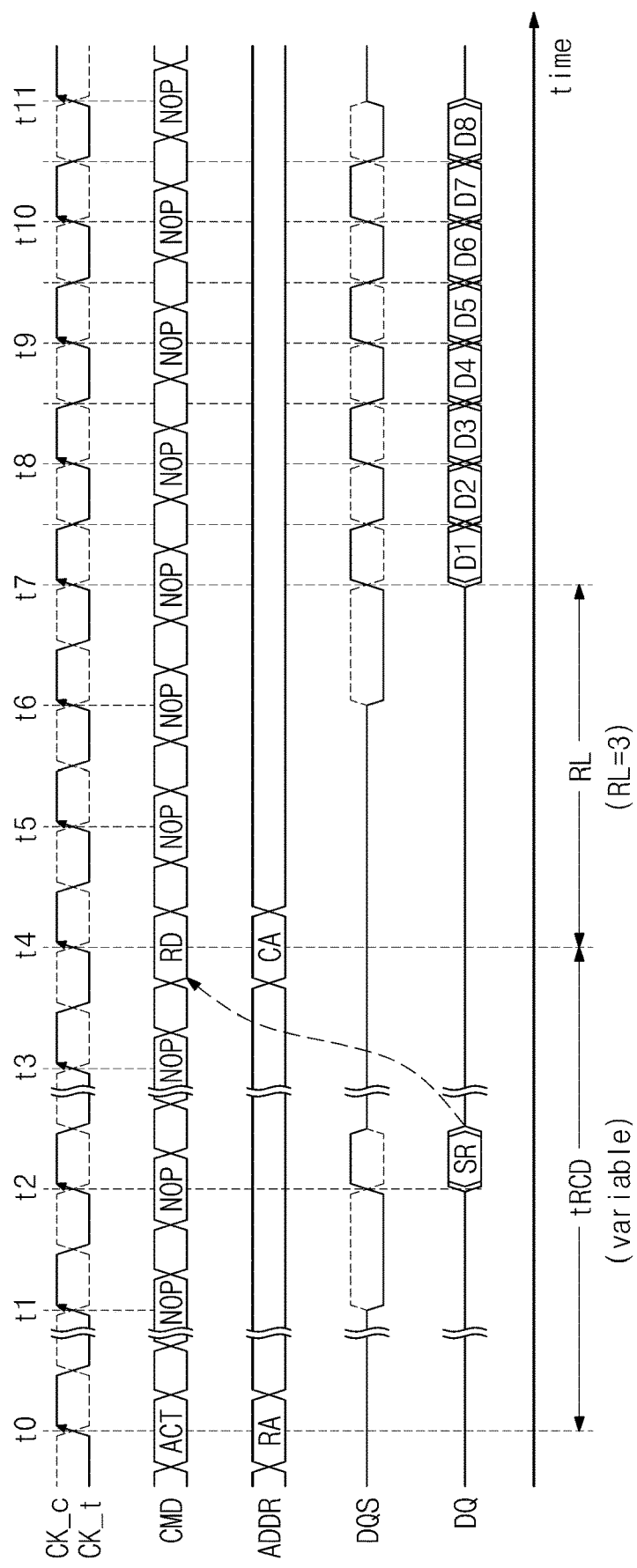
FIGS. 8 and 9 are timing diagrams illustrating an operation of a memory module of FIG. 2.
Figure 9:
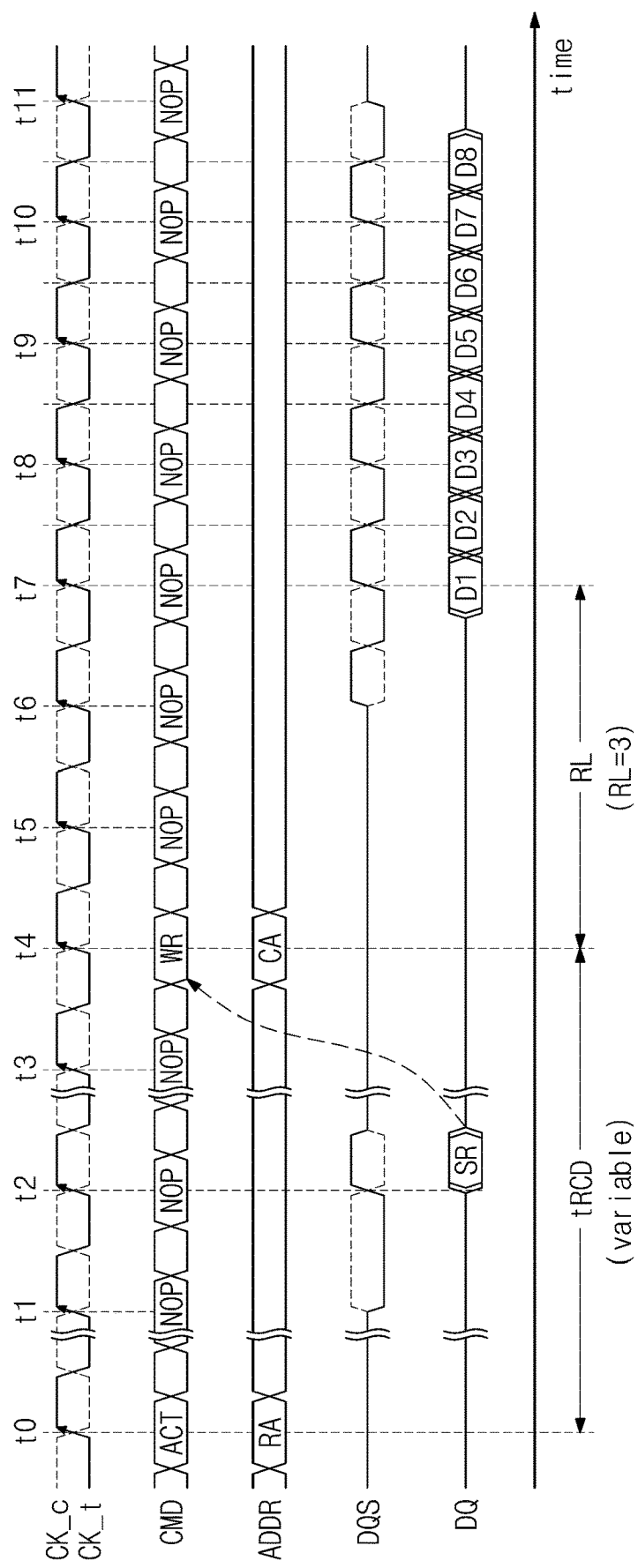

FIGS. 8 and 9 are timing diagrams illustrating an operation of a memory module of FIG. 2. In example embodiments, a read operation will be described with reference to FIG. 8, and a write operation will be described with reference to FIG. 9.

Referring to FIGS. 2 and 8, the memory module 110 may receive a command CMD and an address ADDR in synchronization with clock signals CK_t and CK_c. At t0, the memory module 120 may receive an active command ACT and a row address RA. In example embodiments, the row address RA may include information about a page or a row corresponding to the nonvolatile memory device 122 or the DRAM 123.

The memory module 120 may activate a page or a row corresponding to the received row address RA in response to the active command ACT. For example, as described above, in the case where the row address RA corresponds to a page of the nonvolatile memory device 122, the memory module 120 may read data of a corresponding page and may store the read data in the data buffer 121a. Alternatively, in the case where the row address RA corresponds to a row of the DRAM 123, the memory module 120 may activate a corresponding row. After activating the selected page or the selected row, the memory module 120 may write the status information SR in the status register 121b.

Afterwards, the memory module 120 may transmit the status information SR to the processor 110. For example, as illustrated in FIG. FIG. 8, at t2, the memory module 120 may provide the processor 110 with the status information SR through the data signal DQ and the data strobe signal DQS.

In some embodiments, the memory module 120 may transmit the status information SR to the processor 110 under control of the processor 110. For example, the processor 110 may read the status information SR from the status register 121b using a mode register set (MRS) and a read command.

In some embodiments, the memory module 120 may provide the status information SR to the processor 110 through separate signal lines. Alternatively, the memory module 120 may transmit the status information SR to the processor 110 based on serial communication such as I2C, SMBus, PMBus, IPMI, MCTP, or the like.

The processor 110 may transmit a read command RD (i.e., CMD_RD) or a column address CA to the memory module 120 in response to the status information SR. The memory module 120 may receive a read command RD and a column address CA and may output data D1 to D8 after a read latency RL in response to the read command CMD_RD. For example, the memory module 120 may output data of an activated page and data, corresponding to the received column address CA, from among data of an activated row.

In example embodiments, in the case where a page of the nonvolatile memory device 122 is activated, the memory module 120 may output data, corresponding to the column address CA, from among data stored in the data buffer 121a. In the case where a row of the DRAM 123 is activated, the memory module 120 may output data, corresponding to the column address CA, from among data of the activated row.

Referring to FIGS. 2 and 9, a write operation of the memory module 120 may be similar to a read operation thereof. At t0, the memory module 120 may receive an active command ACT and a row address RA and may activate a page or row corresponding to the received row address RA.

After activating the selected page or the selected row, the memory module 120 may transmit the status information SR to the processor 110. The processor 110 may transmit a write command WR or a column address CA to the memory module 120 in response to the status information SR and may transmit data D1 to D8 to the memory module 120 after a write latency WL.

In example embodiments, in the case where a page of the nonvolatile memory device 122 is activated, the memory module 120 may store the received data D1 to D8 in the data buffer 121a; in the case where a row of the DRAM 123 is activated, the memory module 120 may store the received data D1 to D8 at the activated row.

As described with reference to FIGS. 8 and 9, the memory module 120 may receive the active command ACT and may transmit the status information SR to the processor 110 after a corresponding page or a corresponding row is activated. The processor 110 may transmit a read command or a write command to the memory module 120 in response to the status information SR. That is, a time interval (i.e., tRCD) between the active command ACT and the read or write command RD or WR may be variably adjusted. Thus, the processor 110 may control different types of memories (with different operating speeds) through a common data bus and interface.

Figure 10:
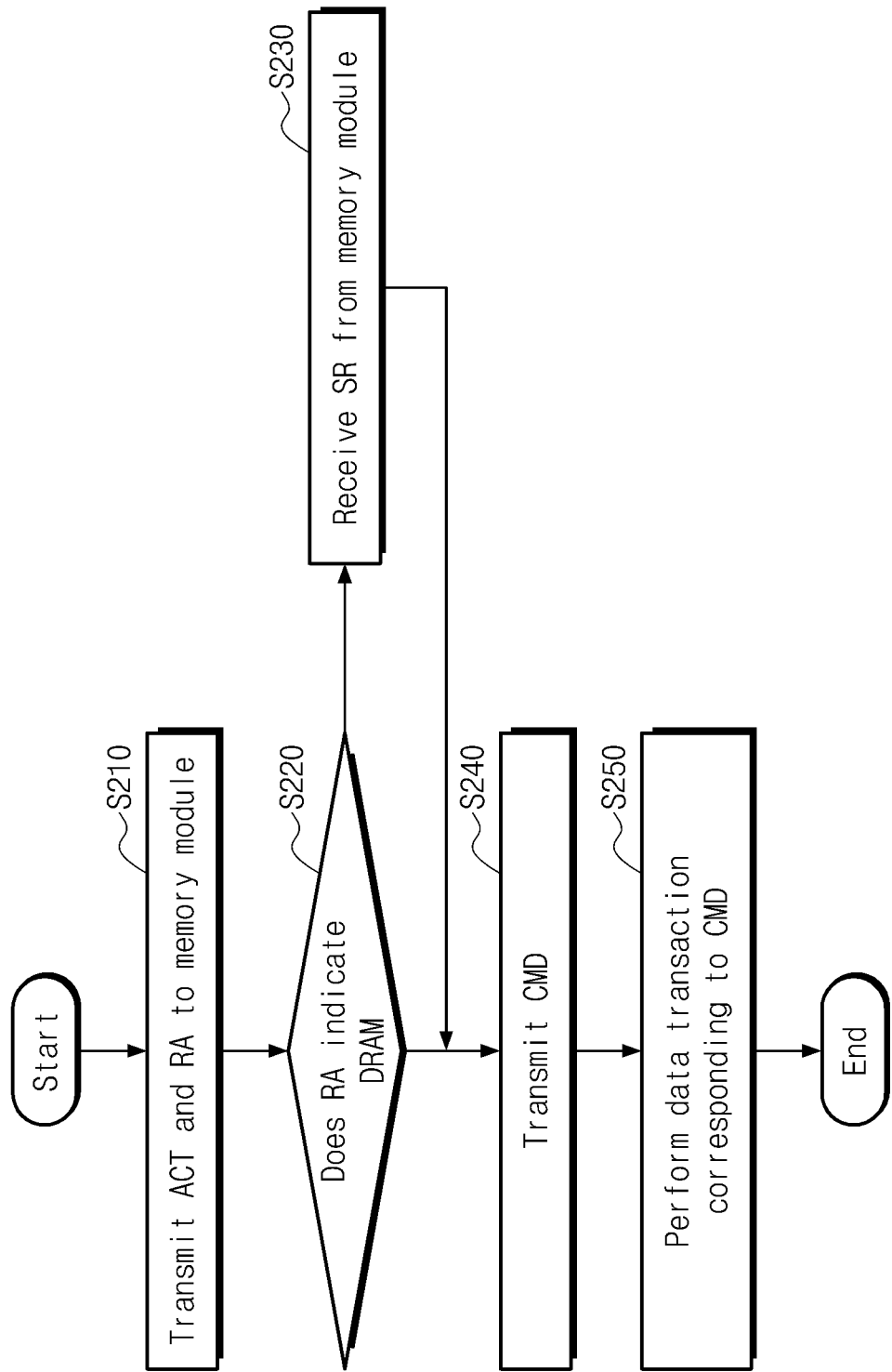
FIG. 10 is a flow chart illustrating another embodiment of a processor of FIG. 1.

FIG. 10 is a flowchart illustrating example embodiments of a processor of FIG. 1 Referring to FIGS. 1, 2, and 10, in a step S210, the processor 110 may transmit an active command ACT and a row address RA to the memory module 120.

In a step 220, the processor 110 may determine whether a row address RA indicates the DRAM device 123. For example, the processor 110 may recognize that the memory module 123 includes the nonvolatile memory device 122 and the DRAM device 123, based on device information DI from the SPD 124. The processor 110 may manage storage spaces of the nonvolatile memory device 122 and the DRAM 123 included in the memory module 120. That is, the processor 110 may respectively access the nonvolatile memory device 122 and the DRAM 123.

In example embodiments, in the case where the processor 110 accesses the nonvolatile memory device 122, the row address RA may include information about a page of the nonvolatile memory device 122. In the case where the processor 110 accesses the DRAM device 123, the row address RA may include information about a row of the DRAM device 123. That is, the processor 110 may access the nonvolatile memory device 122 or the DRAM device 123 based on the row address RA.

In the case where the row address RA indicates a row of the DRAM device 123 (i.e., the processor 110 accesses the DRAM 123), in a step S240, the processor 110 may transmit the command CMD (i.e., an operation command). In a step S250, the processor 110 may perform the data transaction corresponding to the command CMD.

In the case where the row address RA does not indicate a row of the DRAM device 123 (i.e., the processor 110 accesses the nonvolatile memory device 122), in a step S230, the processor 110 may receive the status information SR from the memory module 120. Afterwards, the processor 110 may perform operations of steps S240 to S250.

As described above, the processor 110 may receive the status information SR based on a target device to be accessed, thereby making it possible to adjust a latency (in other words, tRCD) return to the active command. Thus, it may be possible to control different types of accessed over memories using a common bus.

Figure 11:
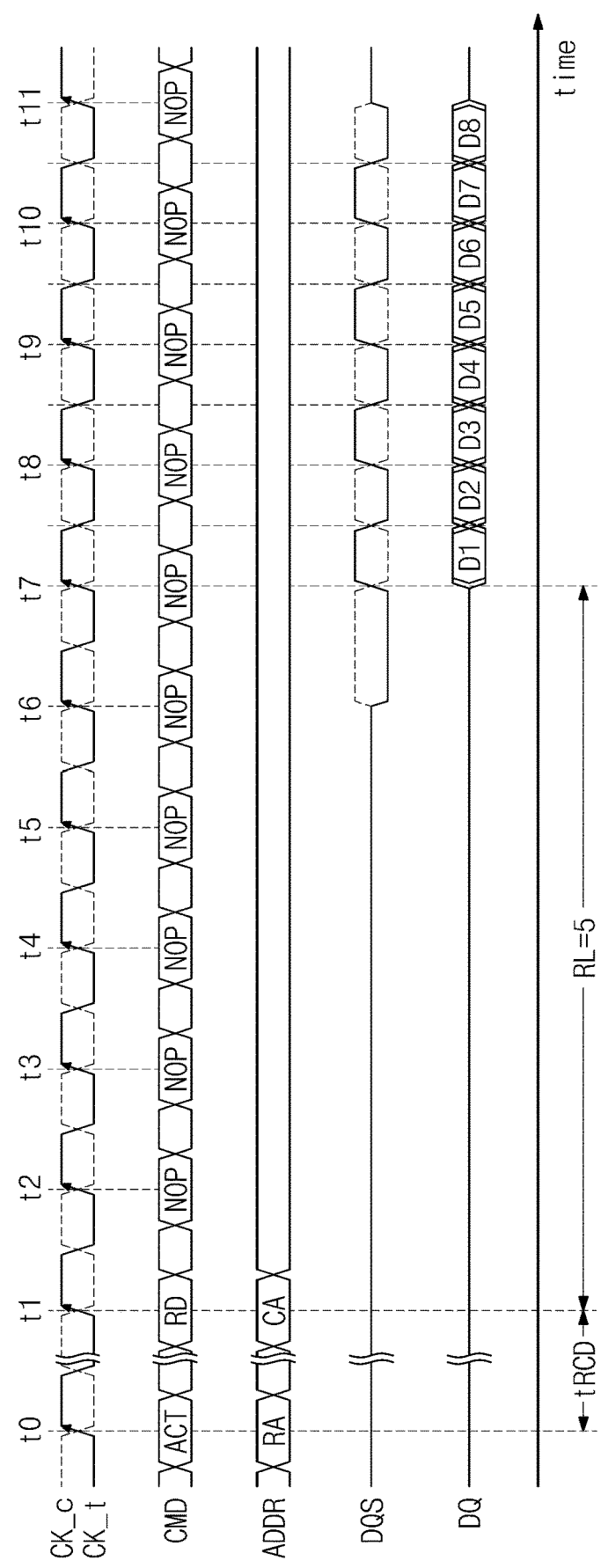
FIG. 11 is a timing diagram illustrating an access operation about a DRAM of FIG. 10.

FIG. 11 is a timing diagram illustrating an access operation about a DRAM of FIG. 10. Referring to FIGS. 1, 2, and 11, the memory module 110 may receive an active command ACT and a row address RA from the processor 110. After a time tRCD, the memory module 120 may receive a read command CMD_RD and a column address CA from the processor 110. In example embodiments, the memory module 120 may activate a row corresponding to the received row address RA during the time tRCD. After a read latency RL elapses from a point in time when the read command CMD_RD is received, the memory module 120 may sequentially output data D1 to D8.

The access operation about the DRAM device described with reference to FIG. 11 may be similar to a DRAM device read operation. That is, in the case where the processor 110 accesses the DRAM device 123, a command and data may be exchanged between the processor 110 and the DRAM 123 without a transfer of the status information SR, based on a given latency.

In the case where the processor 110 accesses the nonvolatile memory device 122, the processor 110 may receive the status information SR while exchanging the command and the data with the nonvolatile memory device 122. That is, the processor 110 may normally access the nonvolatile memory device 122 by adjusting the command and data transfer latency.

Figure 12:
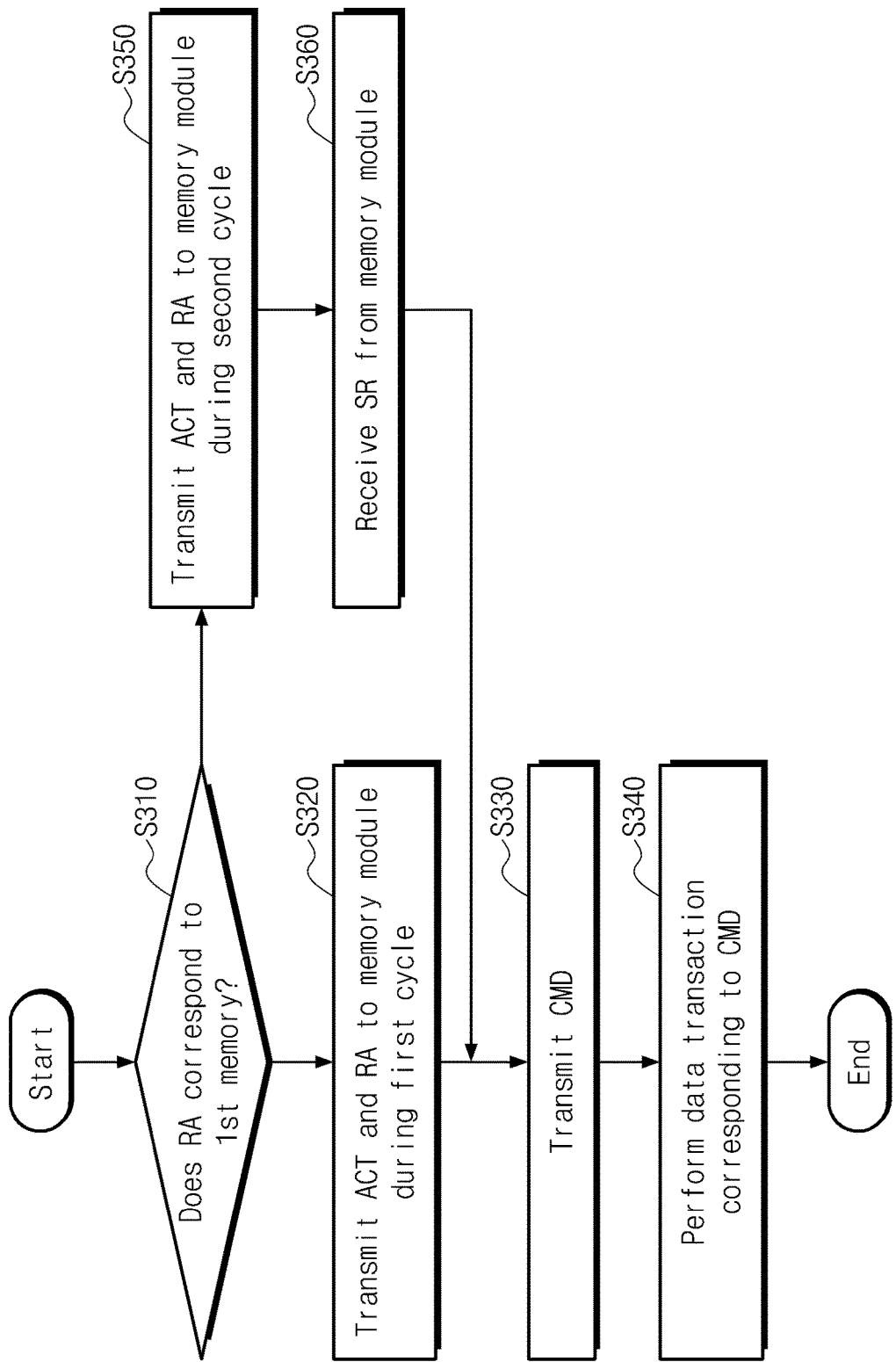
FIG. 12 is a flow chart illustrating still another embodiment of a processor of FIG. 1.

FIG. 12 is a flowchart illustrating example embodiments of a processor of FIG. 1. Referring to FIGS. 1, 2, and 12, in a step S310, the processor 110 may determine whether a row address RA to be transmitted corresponds to a first type of memory. For example, as described above, the memory module 120 may include the nonvolatile memory device 122 and the DRAM device 123. In other words, the memory module 120 may include first and second memories of different types. The processor 110 may access the first or second memory based on the row address RA.

In the case where the row address RA corresponds to the first memory (in other words, the processor 110 will access the first memory), in a step S320, the processor 110 may transmit an active command ACT and a row address RA to the memory module 120 during a first cycle. For example, in the case where the processor 110 accesses the DRAM device 123, the processor 110 may transmit the active command ACT and the row address RA to the memory module 120 during the first cycle.

Afterwards, the processor 110 may perform operations of steps S330 and S340. Operations of steps S330 and S340 may be similar to those of steps S240 and S250 of FIG. 10.

In the case where the row address RA corresponds to the second type of memory (in other words, the processor 110 accesses the second type of memory), in step S350, the processor 110 may transmit the active command ACT and the row address RA to the memory module 120 during a second cycle. For example, in the case where the processor 110 accesses the nonvolatile memory device 122, the processor 110 may transmit the active command ACT and the row address RA to the memory module 120 during the second cycle. In example embodiments, each of the first and second cycles may be a multiple of a period of the clock signals CK_t and CK_c. The second cycle may be later than the first cycle.

That is, in the case where the processor 110 accesses the nonvolatile memory device 122, the processor 110 may transmit a plurality of active commands ACT and a plurality of row addresses RA to the memory module 120 during a plurality of clock cycles. In example embodiments, the plurality of active commands ACT may include a sub command about a command to be transmitted later. The plurality of row addresses may include information about a location of the data buffer 121a or a chip address, a block address, a page address, and the like of the nonvolatile memory device 122.

In a step S360, the processor 110 may receive the status information SR from the memory module 120. Afterwards, the processor 110 may perform operations of steps S330 and S340. Operations of steps S360, S330, and S340 may be similar to those of steps S230, S240, and S250 FIG. 10.

In example embodiments, the processor 110 may adjust the first or second cycle based on a type of memory to be accessed. Furthermore, the processor 110 may set, according to a type of a memory to be accessed, information about the first or second cycle through the mode register set MRS. As the capacity of a memory to be accessed becomes larger, the first or second cycle may become longer.

According to example embodiments of the inventive concept, the processor 110 may transmit a plurality of active commands to the memory module 120 based on a type of a memory to be accessed. The plurality of active commands may be transmitted together with a plurality of row addresses. In this case, since a wide address range is supported, an access to the nonvolatile memory device 122 having a large volume may be normally accessed.

Figure 13:
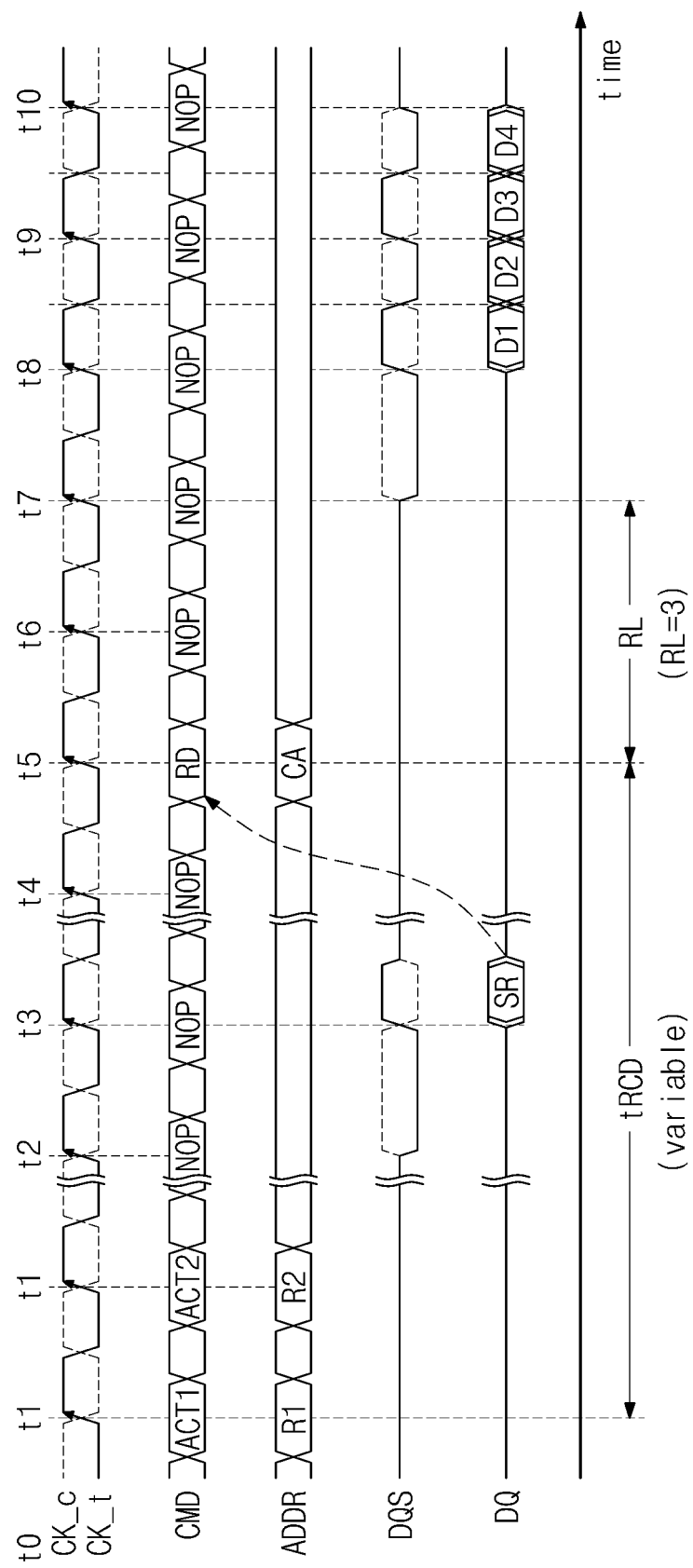
FIG. 13 is a timing diagram for describing an operation of FIG. 12.

FIG. 13 is a timing diagram for describing an operation of FIG. 12. In example embodiments, a timing diagram illustrated in FIG. 13 is a timing diagram for describing an access to a second memory (i.e., an access to the nonvolatile memory device 122).

Referring to FIGS. 1, 2, and 13, at t0, the memory module 110 may receive a first active command ACT1 and a first row address RA1. At t1, the memory module 110 may receive a second active command ACT2 and a second row address RA2.

The first and second active commands ACT1 and ACT2 may include a sub command about a command (i.e., a read command CMD_RD) to be transmitted later. The first and second row addresses may include information about a chip address, a block address, a page address, and the like of the nonvolatile memory device 122.

The memory module 120 may activate a page corresponding to the first and second row addresses RA1 and RA2 in response to the first and second active commands ACT1 and ACT2. Afterwards, the memory module 120 may transmit the status information SR to the processor 110. In example embodiments, the status information SR may be transmitted, as described above, through various techniques.

As described above, the processor 110 may transmit the read command CMD_RD and the column address CA to the memory module 120 in response to the status information SR, and after a given read latency, the memory module 120 may output readout data D1 to D4 in response to the read command CMD_RD.

In example embodiments, the processor 110 may transmit the read command CMD_RD during a plurality of cycles. For example, the processor 110 may transmit two active read commands and two column addresses to the memory module 120 during two cycles.

In example embodiments, the processor 110 may previously set a cycle in which an active command ACT, a row address RA, a read or write command CMD (i.e., RD or WR), or a column address CA is transmitted through a mode register set MRS or a serial bus. For example, in the case where the active command ACT is set as being received during four cycles, the processor 110 may transmit four active commands ACT to the memory module 120 during four cycles. A write operation may be performed to be similar to the read operation.

According to an embodiment of the inventive concept, the processor 110 may adjust a transmission cycle of a command (in particular, an active command) based on a kind of a memory to be accessed. In this case, since a wide address range is supported, the nonvolatile memory device 122 of a large volume may be normally accessed.

Figure 14:
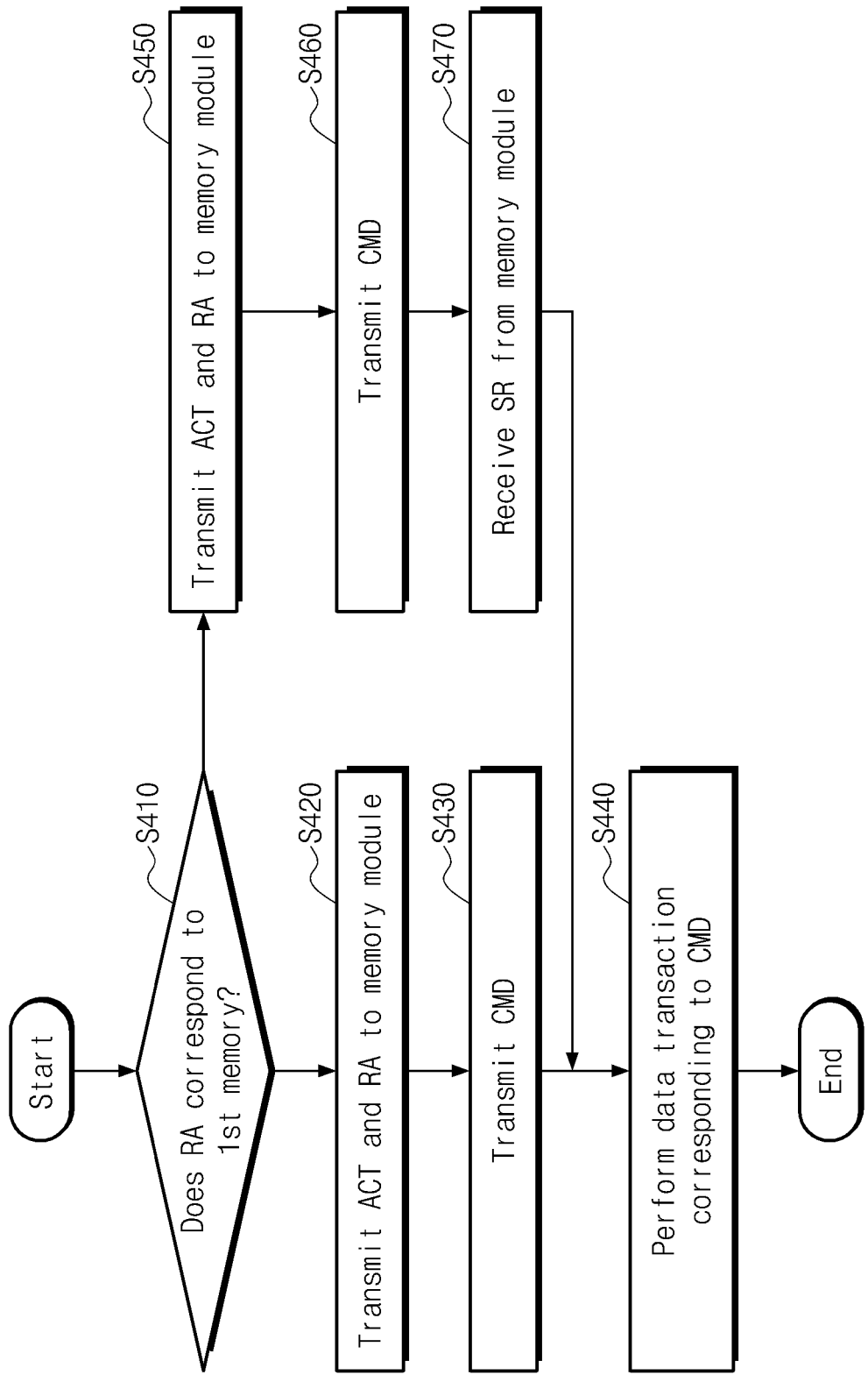
FIG. 14 is a flow chart illustrating an operation of a processor of FIG. 1, according to still another embodiment of the inventive concept.

FIG. 14 is a flowchart illustrating an operation of a processor of FIG. 1, according to example embodiments of the inventive concept. Referring to FIGS. 1, 2, and 14, the processor 110 may perform an operation of a step S410. The operation of the step S410 may be similar to that of the step S310 of FIG. 12.

In the case where a row address RA corresponds to a first type of memory (in other words, in the case where the processor 110 will access the first type of memory), the processor 110 may perform operations of steps S420 to S440. The operations of steps S420, S430, and S440 may be similar to those of steps S210, S240, and S250 of FIG. 10.

In the case where a row address RA corresponds to a second type of memory (in other words, in the case where the processor 110 will access the second type of memory), the processor 110 may perform operations of steps S450 to S470. Unlike the above description, the processor 110 may receive the status information SR from the memory module 120 after transmitting a command CMD.

That is, in the step S450, the processor 110 may transmit the active command ACT and the row address RA; after a time (i.e., tRCD) elapses, in the step S460, the processor 110 may transmit a read or write command RD or WR to the memory module 120. In the step S470, the processor 110 may receive the status information SR from the memory module 120.

The processor 110 may perform an operation of the step S440 in response to the status information SR.

Figure 15:
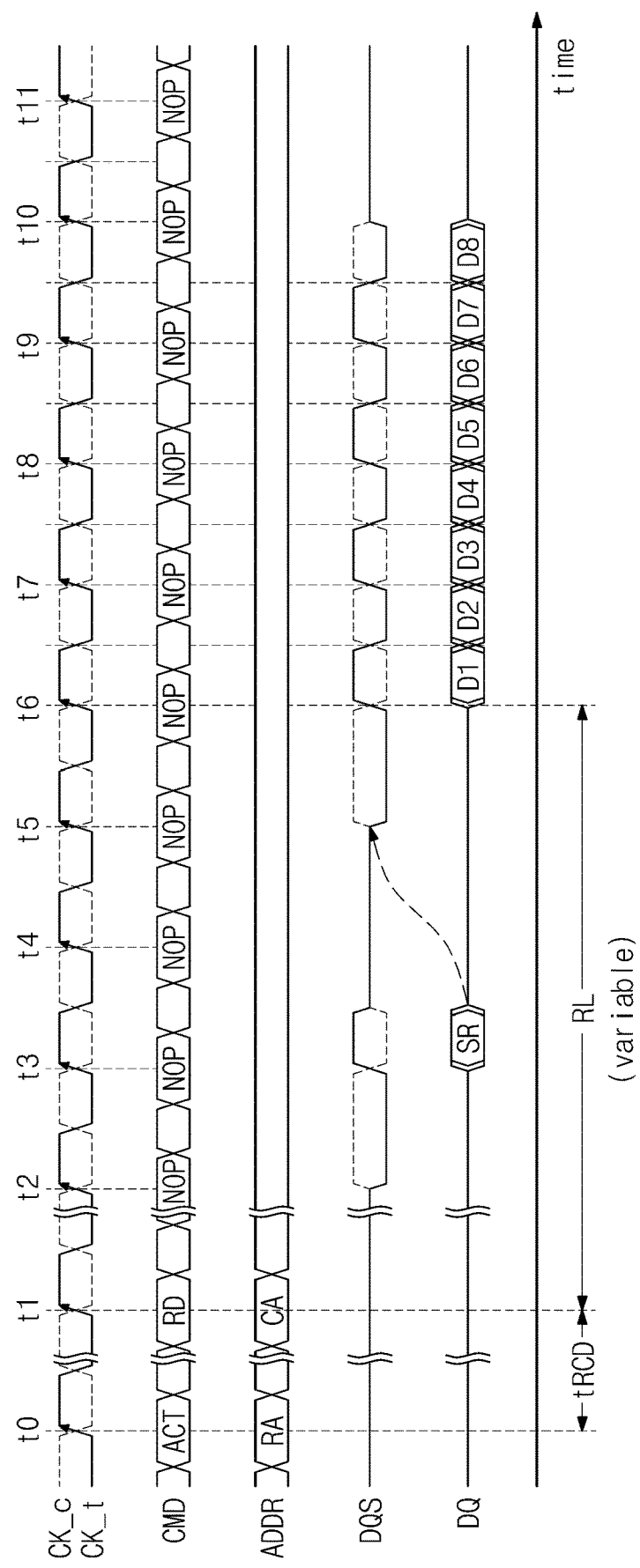
FIG. 15 is a block diagram for describing an operation of FIG. 14.

FIG. 15 is a block diagram for describing an operation of FIG. 14. Referring to FIGS. 1, 2, and 15, the memory module 120 may receive an active command ACT and a row address RA. After a time tRCD, the memory module 120 may receive a read command CMD_RD and a column address CA from the processor 110. Afterwards, the memory module 120 may transmit the status information SR to the processor 110. In example embodiments, the status information SR may be provided to the processor 110 through various techniques. The processor 110 may perform the data transaction corresponding to the read command CMD_RD in response to the status information SR.

Like the above-described example embodiments, a latency tRCD between the active command ACT and the read command RD may be adjusted, and a read latency RL between the read command RD and the data transaction may be also adjusted. Thus, it may be possible to drive different types of memories connected via a common bus.

In the case where the memory module 120 does not activate a selected page or a selected row within a specific time, the memory module 120 may transmit the status information SR, indicating that activation is delayed, to the processor 110. The processor 110 may receive the status information SR about the delayed activation and may first perform a different operation in response to the received information.

Figure 16:
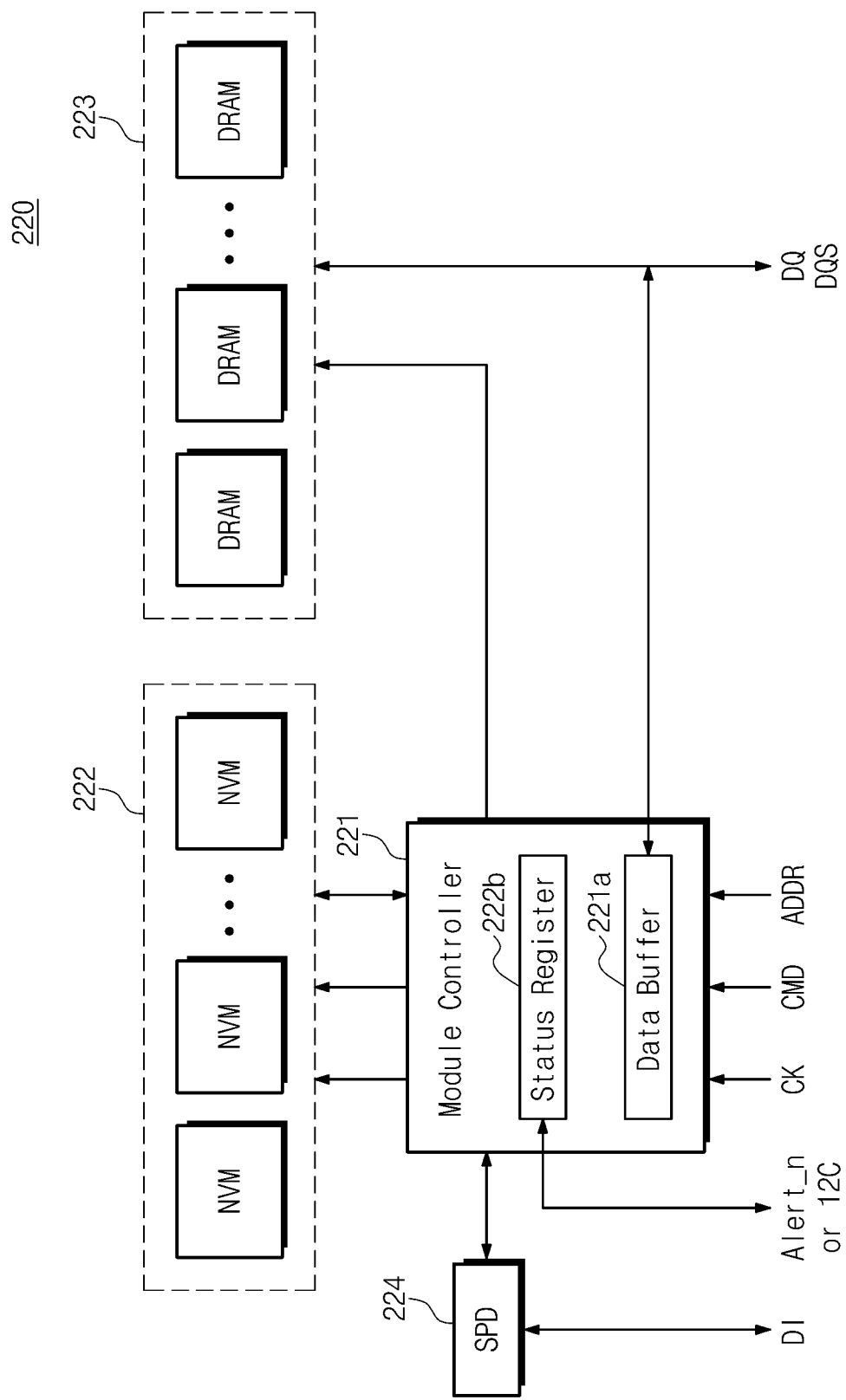
FIG. 16 is a block diagram illustrating a memory module according to another embodiment of the inventive concept.

FIG. 16 is a block diagram illustrating a memory module according to example embodiments of the inventive concept. Referring to FIG. 16, a memory module 220 may contain a module controller 221, a nonvolatile memory device 222, a DRAM 223, and a SPD 224. The module controller 221 may include a data buffer 221a and a status register 222b. It will be understood that the module controller 221, the nonvolatile memory device 222, the DRAM 223, the SPD 224, the data buffer 221a, and the status register 222b may be analogous to devices described above.

The module controller 221 may provide the processor 110 with status information SR through a separate signal line (e.g., Alert_n or $I_{2C}$).

Figure 17:
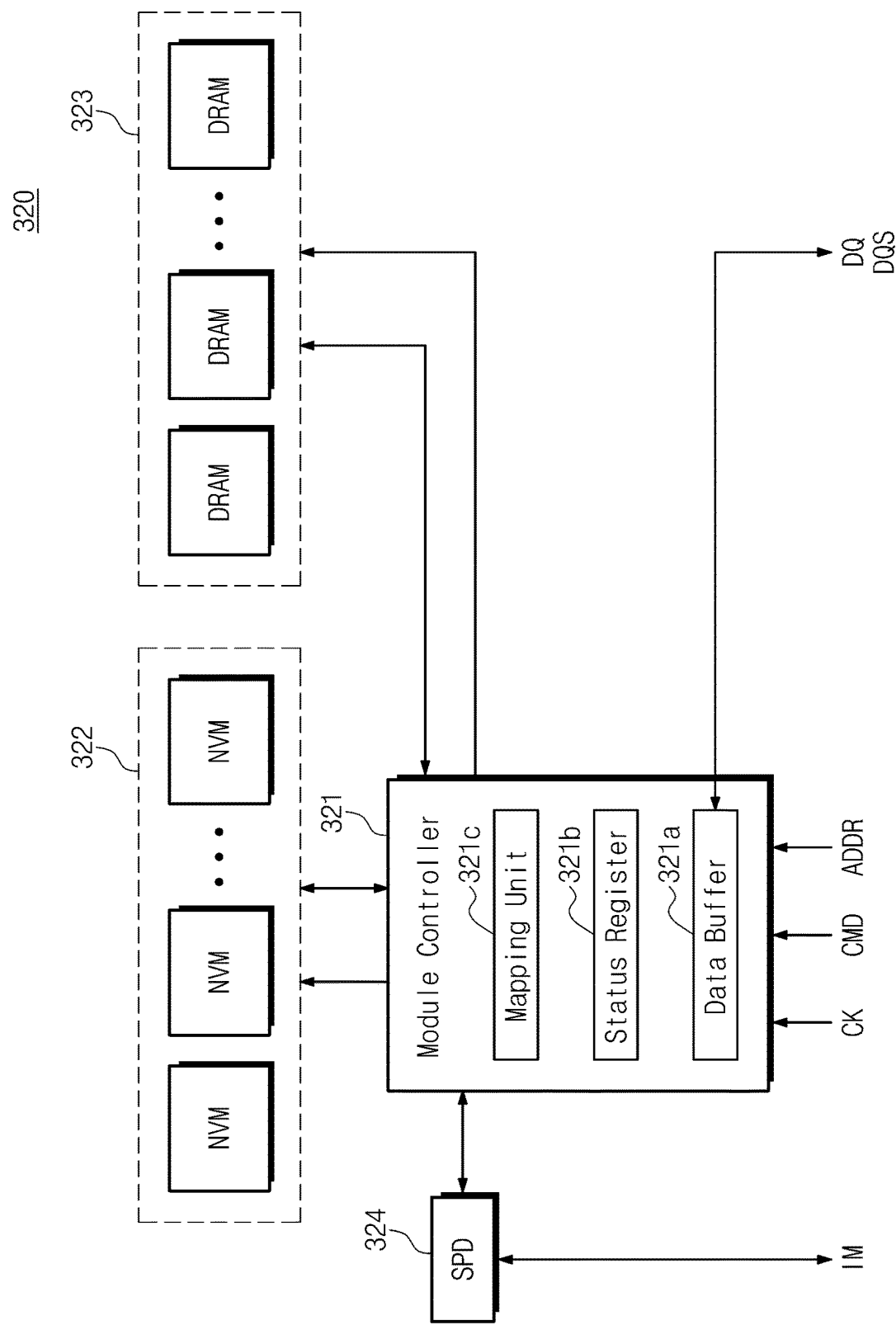
FIG. 17 is a block diagram illustrating a memory module according to another embodiment of the inventive concept.

FIG. 17 is a block diagram illustrating a memory module according to another embodiment of the inventive concept. FIG. 18 is a diagram illustrating a mapping unit of FIG. 17. Referring to FIG. 17, a memory module 320 may include a memory module 321, a nonvolatile memory device 322, a DRAM 323, and a SPD 324. The module controller 321 may include a data buffer 321a, a status register 321b, and a mapping unit 321c. It will be understood that the module controller 321, the nonvolatile memory device 322, the DRAM device 323, the SPD 324, the data buffer 321a, and the status register 321b may be analogous to devices described above.

Unlike the above-described memory modules, the processor 110 may not distinguish the nonvolatile memory device 322 and the DRAM device 323 included in the memory module 320. That is, the processor 110 may recognize areas of the nonvolatile memory device 322 and the DRAM device 323 of the memory module 320 as one contiguous memory area and may write data, which is received through the data signal DQ and the data strobe signal DQS, at areas of the nonvolatile memory device 322 and the DRAM device 323 under management of the memory module 320.

For example, the mapping unit 321c of the memory module 320 may map addresses from the processor 110 to addresses of the nonvolatile memory device 322 and the DRAM device 323. For example, as illustrated in FIG. 18, a first address ADDR_1 from the processor 110 may be mapped to correspond to a first nonvolatile area addr_n1 of the nonvolatile memory device 322 and to a first RAM area addr_r1 of the DRAM device 323. A second address ADDR_2 from the processor 110 may be mapped to correspond to a second RAM area addr_r2 of the DRAM device 323. A third address ADDR_3 from the processor 110 may be mapped to correspond to a third nonvolatile area addr_n3 of the nonvolatile memory device 322.

In the case where the processor 110 accesses a first address (ADDR_1) area under the above-described condition, the processor 110 may access a first nonvolatile area addr_n1 of the nonvolatile memory module 322 or a first RAM area addr_r1 of the DRAM 323 under control of the module controller 321. For example, in the case where the processor 110 reads data of the first address (ADDR_1) area, the module controller 321 may store data, which is stored in the first nonvolatile area addr_n1 of the nonvolatile memory device 322 or the first RAM area addr_r1 of the DRAM 323, in the data buffer 321a and may then transmit status information SR to the processor 110. The following operations may be similar to the above-described operations.

Unlike the above-described memory modules, the memory module of FIG. 17 may store data, which is received through the data signal DQ and the data strobe signal DQS, in the data buffer 321a and may provide data stored in the data buffer 321a to the nonvolatile memory device 322 or the DRAM 323 based on a mapping provided by the mapping unit 321c. Alternatively, the memory module 320 of FIG. 17 may store data, which is read from the nonvolatile memory device 322 or the DRAM 323, in the data buffer 321a and may provide the data stored in the data buffer 321a to the processor 110 through the data signal DQ and the data strobe signal DQS. That is, the processor 110 may recognize the memory module 320 as one memory space, which is divided into a nonvolatile memory area and a RAM area under management of the memory module 320.

Figure 19:
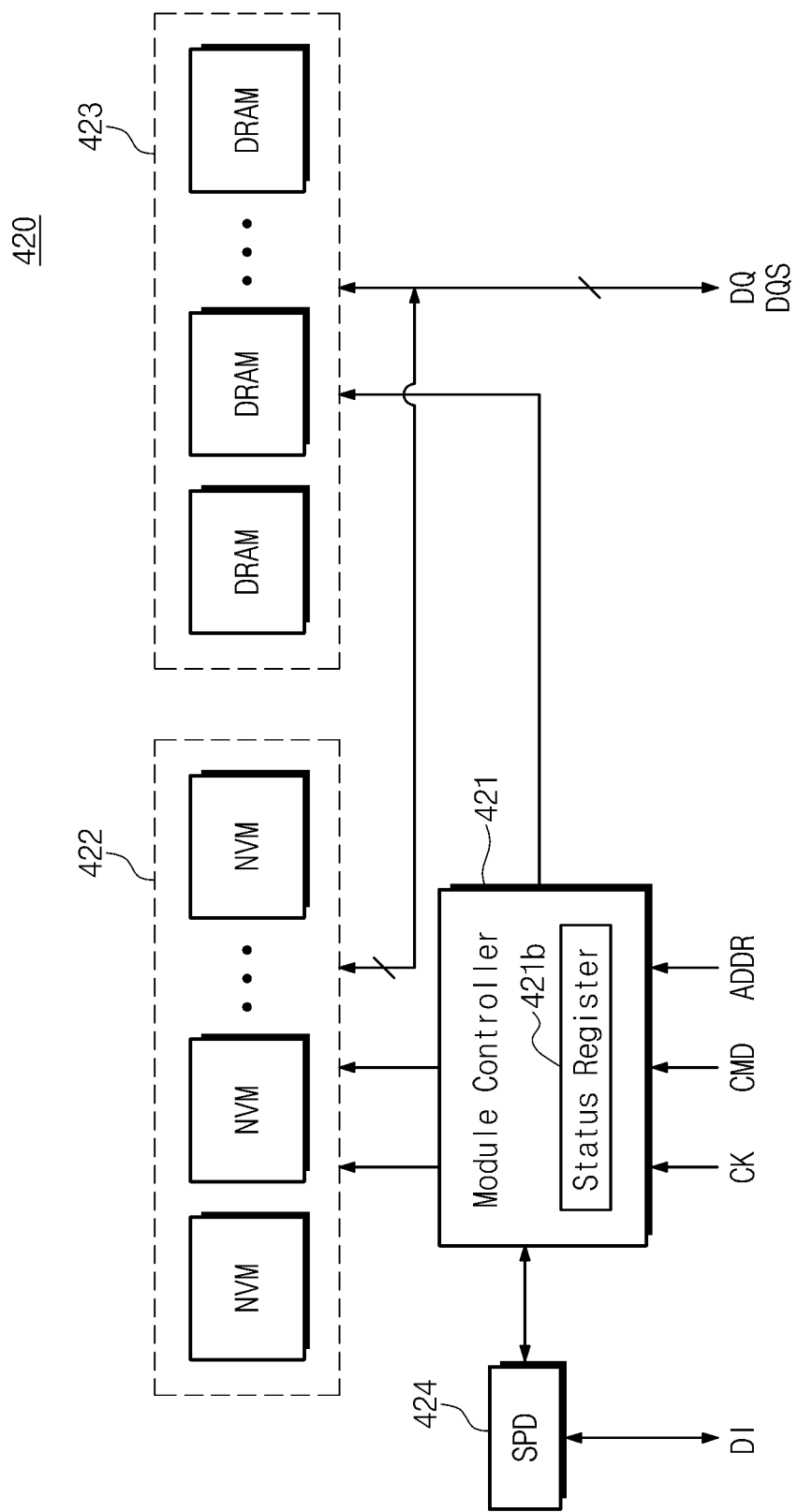
FIG. 19 is a block diagram illustrating a memory module according to another embodiment of the inventive concept.

FIG. 19 is a block diagram illustrating a memory module according to another embodiment of the inventive concept. Referring to FIG. 19, a memory module 420 may include a module controller 421, a nonvolatile memory device 422, a DRAM device 423, and a SPD 424. The module controller 421 may include a status register 421b. It will be understood that the module controller 421, the nonvolatile memory device 422, the DRAM 423, the SPD 424, and the status register 421b can be analogous to devices described above.

In example embodiments, the above-described memory modules may store data, which is read from the nonvolatile memory device 422, in a data buffer in response to an active command ACT and may then transmit status information SR to the processor 110. However, the memory module 420 of FIG. 19 may set data up in the page buffer PB of the nonvolatile memory device 422 in response to the active command ACT and may then provide the status information SR to the processor 110.

In example embodiments, the nonvolatile memory device 422 may directly receive data through the data signal and the data strobe signal DQS and may store the received data. Alternatively, the nonvolatile memory device 422 may directly output data though the data signal DQ and the data strobe signal DQS.

In example embodiments, the nonvolatile memory device 422 may include a plurality of nonvolatile memories NVM, each of which includes a page buffer. The page buffer may store data to be written in a corresponding nonvolatile memory NVM by the page. In example embodiments, the page buffer of the nonvolatile memory device 422 may directly output data though the data signal DQ and the data strobe signal DQS.

Figure 20:
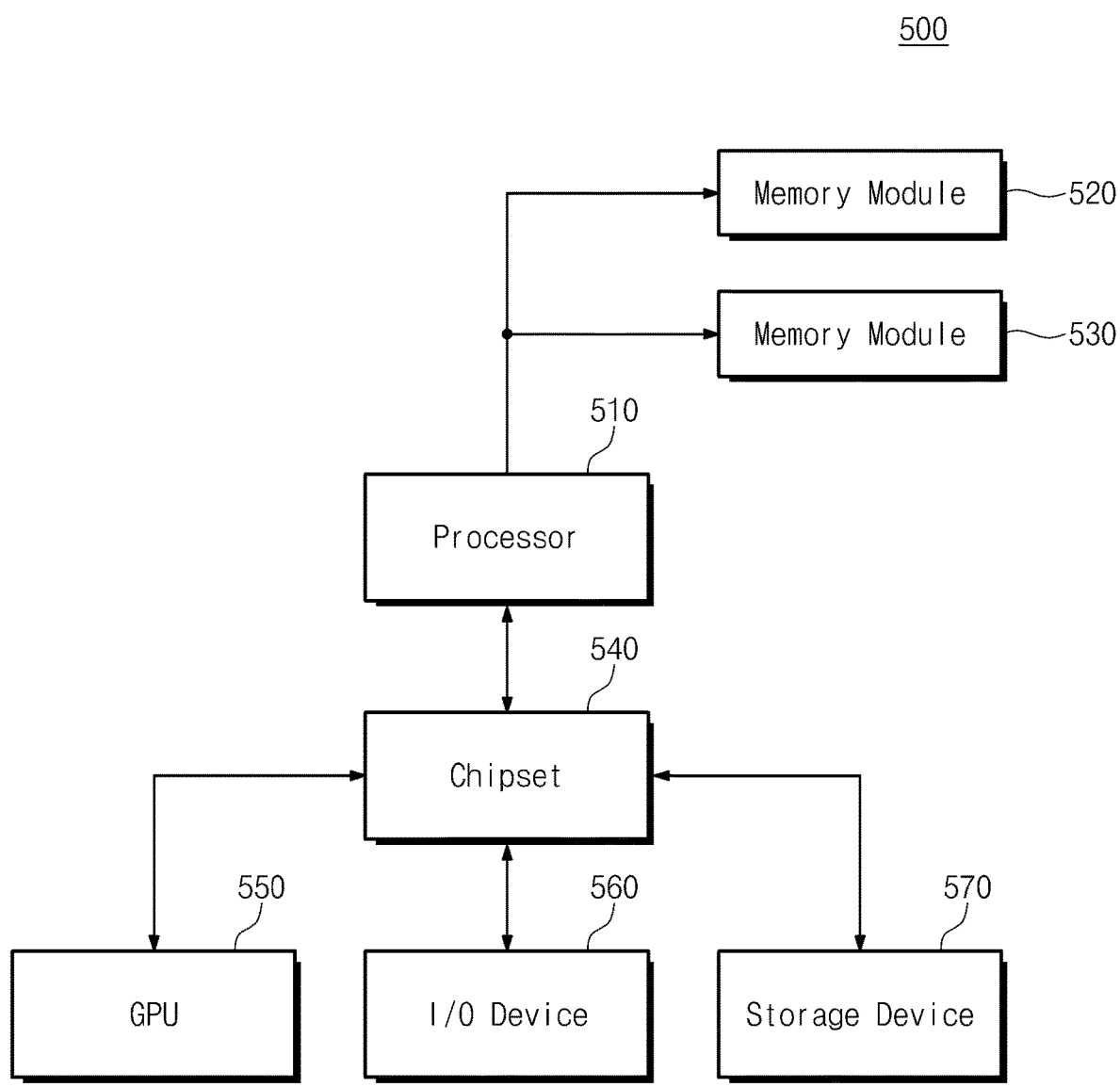
FIG. 20 is a block diagram illustrating a user system according to another embodiment of the inventive concept.

FIG. 20 is a block diagram illustrating a user system according to another embodiment of the inventive concept. Referring to FIG. 20, a computing system 500 may include a processor 510, memory modules 520 and 530, a chipset 540, a graphic processing unit (GPU) 550, an input/output device 560, and a storage device 570. The processor 510, the memory modules 520 and 530, the chipset 540, the GPU 550, the input/output device 560, and the storage device 570 are substantially the same as those of FIG. 1.

The processor 510 may communicate with the memory modules 520 and 530 through a common bus. For example, the memory module (or a first memory module) 520 may be a DRAM memory module composed of DRAMs, and the memory module 530 (or a second memory module) may be a nonvolatile memory module composed of nonvolatile memories.

In example embodiments, the nonvolatile memory module may include an N-type NVDIMM based on DRAM, a F-type NVDIMM based on nonvolatile memory, and a P-type NVDIMM which uses DRAMs and nonvolatile memories together. In the N-type NVDIMM, the processor 510 may perform an operation based on the DRAM, and data stored in the DRAM may be backed up in a nonvolatile memory device of the nonvolatile memory module. In the F-type NVDIMM, the processor 510 may use the nonvolatile memory module as a mass storage device. In the P-type NVDIMM, the processor 510 may use the DRAM and nonvolatile memory device in the nonvolatile memory module together.

The processor 510 may drive each of the memory modules 520 and 530 based on the above-described operating method. For example, in the case where the processor 510 accesses the first memory module 520 which is based on DRAM, the processor 510 may operate based on an access method described with reference to FIG. 11. In the case where the processor 510 accesses the second memory module 530 which is based on nonvolatile memory module, the processor 510 may operate based on an access method described with reference to FIGS. 1 to 19. In other words, the processor 510 may access the first memory module 520 based on a first access manner and may access the second memory module 530 based on a second access manner different from the first access manner.

That is, the processor 510 may use different access methods with respect to memory modules connected through the common bus. In example embodiments, as described above, the processor 510 may identify a module type, a module configuration, a storage capacity, a module kind, an execution environment, and the like of each memory module through an SPD and may respectively control the memory modules based on the identified information. Alternatively, the processor 510 may previously set an operating manner about each memory module through a serial bus such as I2C, SMBus, PMBus, IPMI, MCTP, or the like.

As described above, the processor 510 may communicate with the memory modules through a common bus. In this case, the processor 510 may access the memory modules in different access methods, based on types of the memory modules. That is, each of the memory modules may be controlled such that an interface change is minimized, thereby reducing a cost and improving performance.

Figure 21:
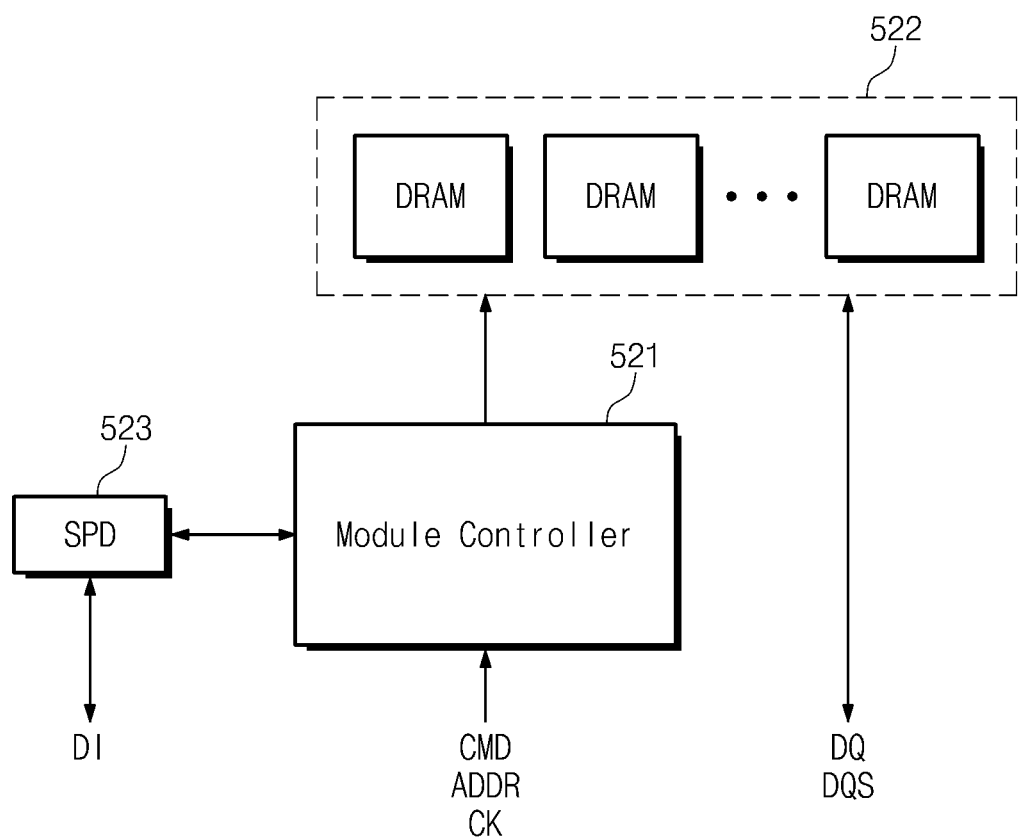
FIGS. 21 to 23 are block diagrams illustrating memory modules according to various embodiments of the inventive concept.
Figure 22:
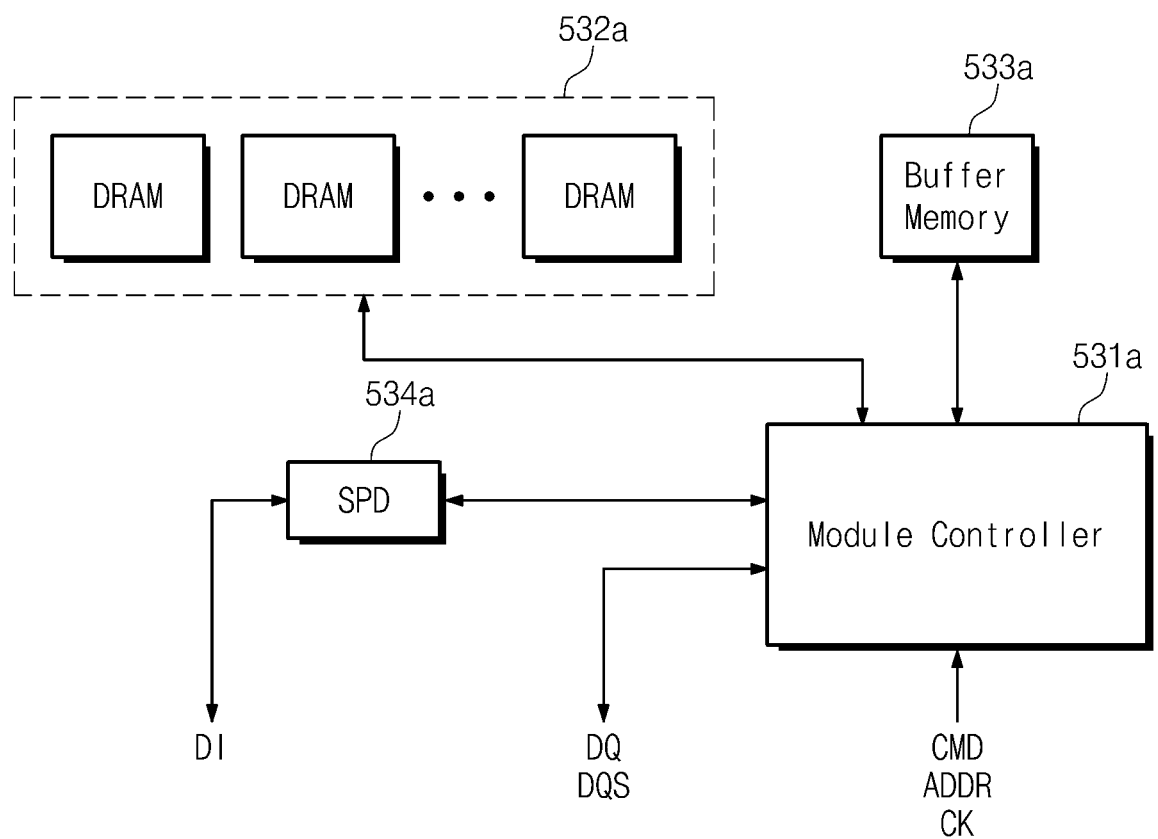
Figure 23:
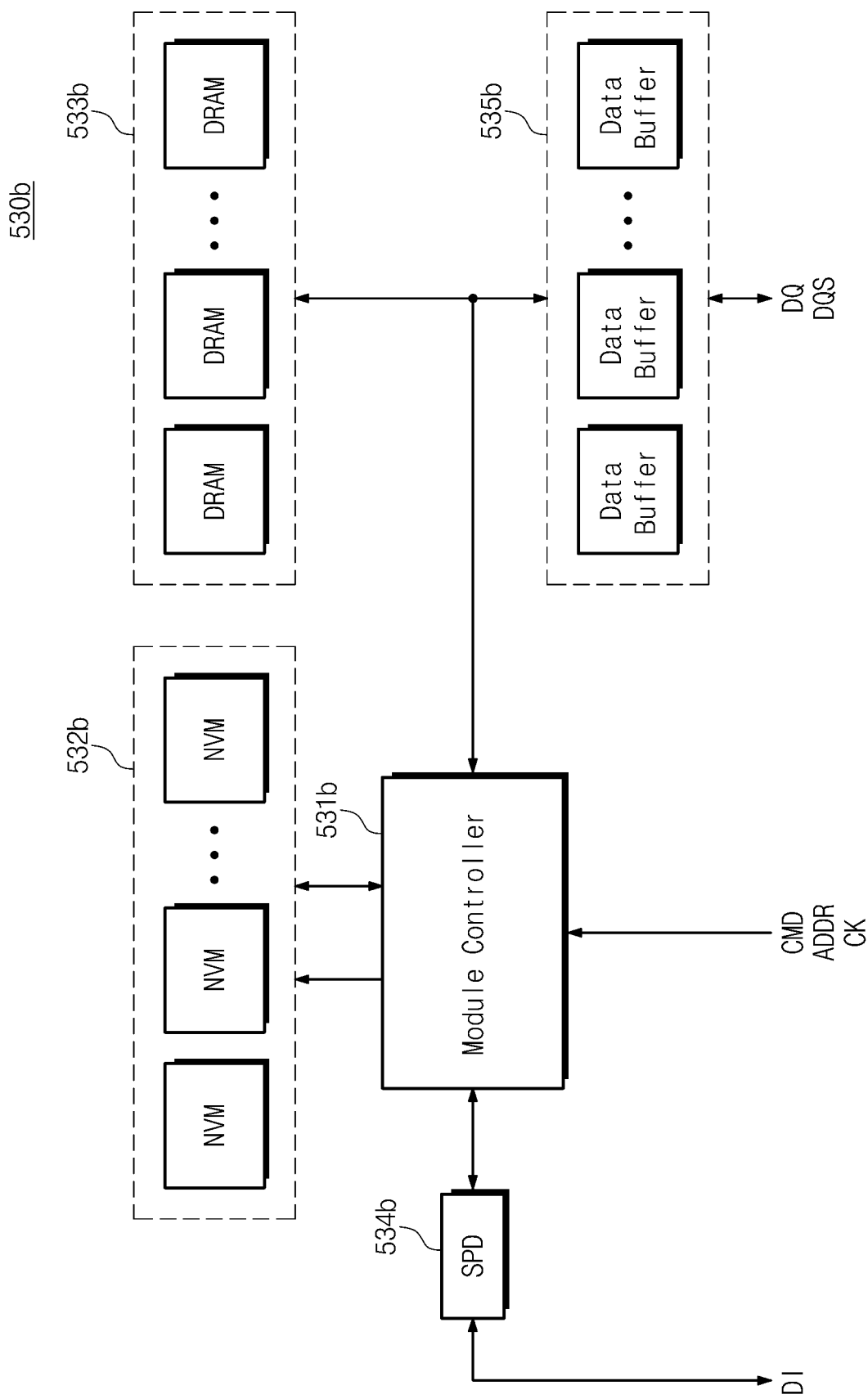

FIGS. 21 to 23 are block diagrams illustrating memory modules according to various embodiments of the inventive concept. Various memory modules are described with reference to FIGS. 21 to 23. However, the scope and spirit of the inventive concept may not be limited thereto. Memory modules may be variously changed or modified without departing from the scope and spirit of the inventive concept.

Referring to FIG. 21, a memory module 520 may include a module controller 521, a DRAM 522, and a SPD 523. The module controller 521, the DRAM 522, and the SPD 523 are described above.

In example embodiments, the memory module 520 may be a memory module of a registered DIMM (RDIMM) type. Based on a clock CK, a command CMD, and an address ADDR from the processor 510, the module controller 521 may output data stored in the DRAM 522 or may write data in the DRAM 522. In example embodiments, the memory module 520 may be a general DRAM module, and the processor 510 may access the memory module 520 based on an access method described with reference to FIG. 11.

Referring to FIG. 22, the memory module 530a may be a memory module of a RDIMM type and may be installed in the DIMM socket so as to communicate with the processor 510. The memory module 530a may include a module controller 531a, a nonvolatile memory device 532a, a buffer memory 533a, and a SPD 534a.

In example embodiments, the memory module 530a may be a F-type NVDIMM. The memory module 530a may be used as a mass storage device through the processor 510. For example, the processor 510 may directly access the nonvolatile memory device 532a of the memory module 530a. In this case, the processor 510 may access the nonvolatile memory device 532a directly or through the module controller 531a, based on an access method described with reference to FIGS. 1 to 19.

The buffer memory 533a may include various information or software required to operate the memory module 530a. In example embodiments, the buffer memory 533a may be provided as a random access memory such as a DRAM or an SRAM.

Referring to FIG. 23, the memory module 530b may include a module controller 531b, a nonvolatile memory device 532b, a DRAM 533b, a SPD 534b, and a data buffer 535b.

Unlike the above-described memory modules, the memory module 530b may further include the data buffer 535b. In example embodiments, the memory module 530b may have a load reduced DIMM (LRDIMM) and may be installed in a DIMM socket so as to communicate with the processor 510.

The data buffer 535b may exchange data with the memory module 510 though a data signal DQ and a data strobe signal DQS. Under control of the module controller 531b, the data buffer 535b may provide the DRAM 533b or the module controller 531b with data received from the processor 510. Data provided to the module controller 531b may be provided to the nonvolatile memory device 532b.

Alternatively, under control of the module controller 531b, the data buffer 535b may provide data from the DRAM 533b or from the module controller 531b. The received data may be provided to the processor through the data signal DQ and the data strobe signal DQS.

The module controller 531b may be accessed according to an access method described with reference to FIGS. 1 to 19. In example embodiments, the module controller 531b may set data up in the data buffer 535b in response to an active command ACT and may then provide status information SR to the processor through a separate signal line.

Data stored in the data buffer 535b may be directly provided to the nonvolatile memory device 532b.

According to the above-described embodiments of the inventive concept, after transmission of an active command to a memory module, a processor may receive status information from the memory module and may transmit an operation command to the memory module in response to the received status information. That is, a latency (i.e., tRCD) between the active command and the operation command may be adjusted according to a type of a memory, and thus various kinds of memories may be driven through one data bus.

Furthermore, different access methods may be used according to memory types, thereby improving the performance of the user system.

Also, an active command and a row address may be transmitted according to a memory type during a plurality of cycles, and thus a wide address range may be managed. With the above description, a memory module, a processor, and a user system including the memory module and the processor may be provided with improved performance and reduced cost.

Figure 24:
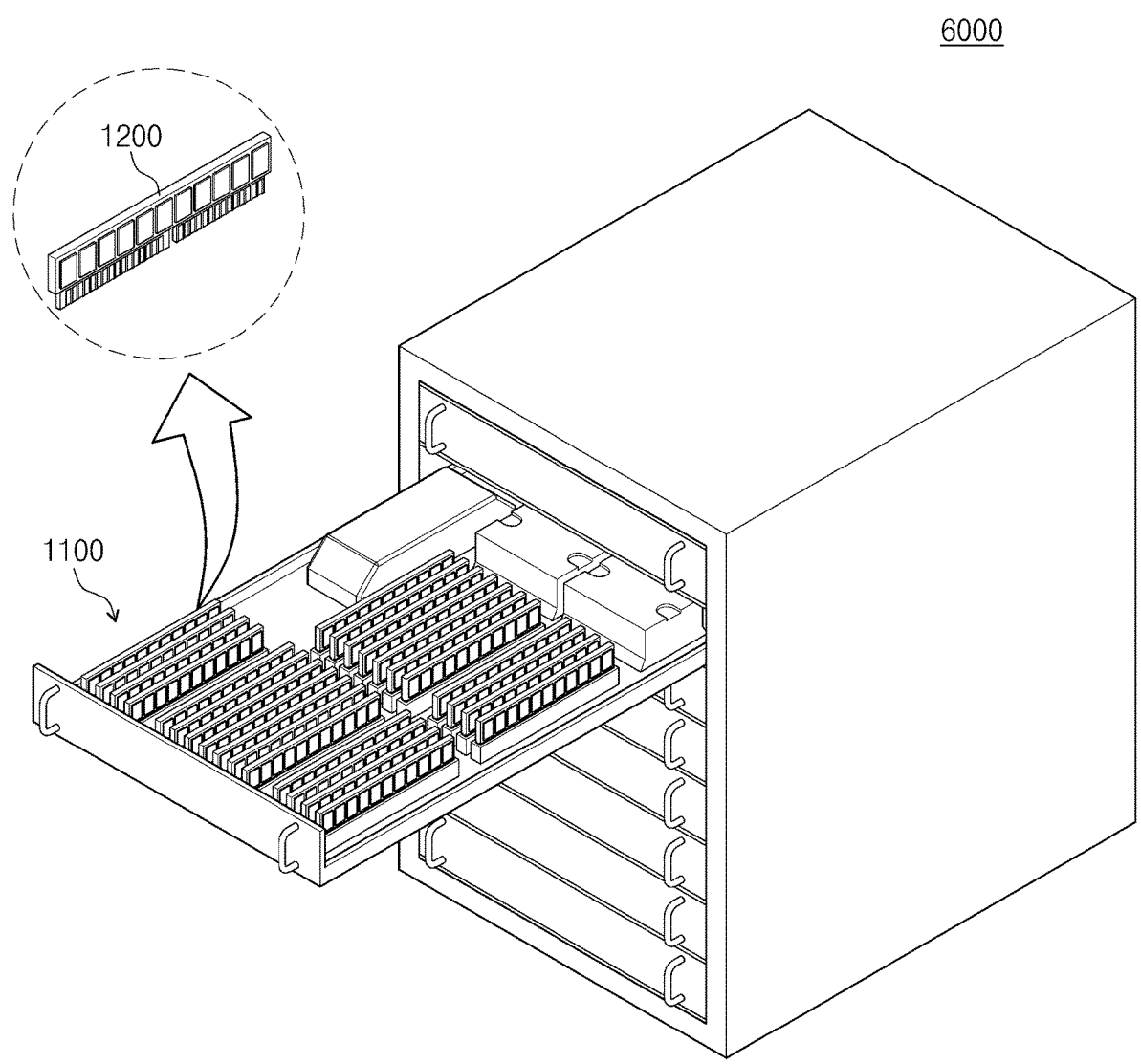
FIG. 24 is a diagram illustrating a server system to which a memory module according to an embodiment of the inventive concept is applied.

FIG. 24 is a diagram illustrating a server system to which a memory module according to an embodiment of the inventive concept may be applied. Referring to FIG. 24, a server system 1000 may include a plurality of server racks 1100. Each of the server racks 1100 may include a plurality of memory modules 1200. The memory modules 1200 may be directly connected with processors respectively included in the server racks 1100. For example, the memory modules 1200 may be a dual in-line memory module and may be mounted on a DIMM socket electrically connected with a processor so as to communicate with the processor. In example embodiments, the memory modules 1200 may be used as storage of the server system 1000. In example embodiments, each of the memory modules 1200 may operate according to an operation method described with reference to FIGS. 1 to 23.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed:

1. An operation method of a memory module comprising:
receiving, from an external of the memory module, a first command and a first address in synchronization with clock signals;
outputting a status information through a signal line, when first data corresponding the first address is available in a data buffer in response to the first command;
receiving, from the external of the memory module, a second command in synchronization with the clock signals after the transmitting the status information; and
outputting, in response to the second command, the first data being available in the data buffer through data lines.

2. The operation method of claim 1, wherein the first data being available in the data buffer is output after a given read latency elapses from a time when the second command is received.

3. The operation method of claim 1, wherein the first command and the address are received during at least two cycles of the clock signals, and the second command is received during one cycle of the clock signals.

4. The operation method of claim 1, wherein a period in which the first command and the first address are received is set through a mode register set (MRS).

5. The operation method of claim 1, wherein a period between the first command and the second command is variably adjusted.

6. The operation method of claim 1, wherein the first command includes a transact identification.

7. The operation method of claim 6, wherein the status information includes information on the transact identification.

8. The operation method of claim 1, wherein the memory module includes a nonvolatile memory and a volatile memory.

9. The operation method of claim 8, further comprising:
receiving a third command and a second address corresponding the volatile memory from the external of the memory module; and
transmitting, in response to the third command, second data to the external of the memory module after a given read latency from a time when the third command is received,
wherein the second data corresponds to the second address, and is stored in the volatile memory.

10. The operation method of claim 1, wherein the memory module is a dual in-line memory module (DIMM).

11. A memory module comprising:
a nonvolatile memory;
a volatile memory; and
a controller including a data buffer,
wherein the controller is configured to:
receive, from an external of the memory module, a first command and a first address in synchronization with clock signals;
make, in response to the first command, first data corresponding the first address to be available in the data buffer, the first data being data stored in the nonvolatile memory or the volatile memory;
transmit status information to the external device through a signal line, when the first data is available in the data buffer;
receive, from the external of the memory module, a second command in synchronization with the clock signals, after transmitting the status information; and
transmit the first data being available in the data buffer to the external of the memory module, though data lines.

12. The memory module of claim 11, wherein the first data being available in the data buffer is output after a given read latency elapses from a time when the second command is received.

13. The memory module of claim 11, wherein the controller receives the first command and the first address during two cycles of the clock signals, and receives the second command during one cycle of the clock signals.

14. The memory module of claim 11, further comprising:
a serial presence detect (SPD) chip configured to store device information on the memory module and communicate with the external of the memory module through a serial bus.

15. The memory module of claim 14, wherein the device information includes at least one of information on a form of the memory module, a module configuration of the memory module, a storage capacity of the memory module, a module type of the memory module, and an execution environment of the memory module.

16. The memory module of claim 11, wherein the controller is further configured to:
   receive a third command and a second address from the external of the memory module, the second address corresponding to the volatile memory; and
   transmit, in response to the third command, second data corresponding to the second address to the external of the memory module through the data lines, after a given read latency elapses from a time when the third command is received, the second data stored in the volatile memory.

17. The memory module of claim 11, wherein the memory module is a dual in-line memory module (DIMM).

18. An operation method of a processor configured to a memory module including a nonvolatile memory and a volatile memory, the operation method comprising:
   transmitting a first command and a first address to the memory module in synchronization with clock signals;
   receiving status information from the memory module through a signal line;
   transmitting, in response to the status information, a second command to the memory module in synchronization with clock signals; and
   receiving first data from the memory module through data lines, when a first read latency elapses from the transmitting the second command.

19. The operation method of claim 18, wherein the first command and the first address are transmitted during two cycles of the clock signals, and
   the second command is transmitted during one cycle of the clock signals.

20. The operation method of claim 18, further comprising:
   transmitting a third command and a second address to the memory module; and
   receiving second data corresponding to the second address from the memory module after a second read latency elapses from a time when the third command and the second address are transmitted.

* * * * *